(12) United States Patent
Tirucherai Muralidharan et al.

(10) Patent No.: US 10,560,220 B2
(45) Date of Patent: Feb. 11, 2020

(54) SYSTEMS AND METHODS FOR MITIGATING DECODING ERRORS DUE TO PUNCTURING OF SYMBOLS

(71) Applicant: QUALCOMM Incorporated, San Diego, CA (US)

(72) Inventors: Vijayvaradharaj Tirucherai Muralidharan, Bangalore (IN); Gowrisankar Somichetty, Bangalore (IN); Shashidhar Vummintala, Bangalore (IN); Kapil Bhattad, Bangalore (IN); Dominique Francois Bressanelli, Eschborn (DE)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/980,084

(22) Filed: May 15, 2018

(65) Prior Publication Data

US 2018/0343085 A1 Nov. 29, 2018

(30) Foreign Application Priority Data

May 23, 2017 (IN) .............................. 201741018048

(51) Int. Cl.
*H04L 1/00* (2006.01)
*H04L 5/00* (2006.01)
(Continued)

(52) U.S. Cl.
CPC .......... *H04L 1/0069* (2013.01); *H04L 1/0013* (2013.01); *H04L 1/0071* (2013.01);
(Continued)

(58) Field of Classification Search
CPC ... H04L 1/0069; H04L 1/0013; H04L 5/0053; H04L 1/1812; H04L 1/0071;
(Continued)

(56) References Cited

U.S. PATENT DOCUMENTS

2002/0031086 A1* 3/2002 Welin ...................... G10L 25/78
370/229
2006/0123277 A1 6/2006 Hocevar
(Continued)

OTHER PUBLICATIONS

Ericsson: "Solutions Supporting Large HARQ-ACK Payloads Multiplexed with PUSCH", 3GPP DRAFT; R1-165150, 3rd Generation Partnership Project (3GPP), Mobile Competence Centre; 650, Route Des Lucioles; F-06921 Sophia-Antipolis Cedex; France vol. RAN WG1, No. Nanjing, China; May 23, 2016-May 27, 2016 May 14, 2016, XP051089832, Retrieved from the Internet: URL:http://www.3gpp.org/ftp/tsg_ran/WG1_RL1/TSGR1_85/Docs/ [retrieved on May 14, 2016], 4 pages.
(Continued)

*Primary Examiner* — Guy J Lamarre
(74) *Attorney, Agent, or Firm* — Loza & Loza, LLP

(57) ABSTRACT

Aspects of the disclosure relate to techniques for mitigating the decoding errors observed at the receiver as a result of puncturing symbols between consecutive subframes having the same transmission direction. To reduce the decoding errors, a plurality of transmission options, each including a number of resource blocks and a modulation and coding scheme (MCS), may be identified. In addition, each transmission option may be associated with one or more puncturing patterns that hinder decoding of a codeword at the receiver. The base station or user equipment (UE) may then select or modify at least one aspect of a scheduling decision involving the communication of the codeword in a given subframe of at least two consecutive subframes to minimize decoding errors. For example, a selected puncturing pattern or a transport block size associated with a selected transmission option may be modified.

28 Claims, 17 Drawing Sheets

(51) Int. Cl.
*H04W 72/12* (2009.01)
*H04L 1/18* (2006.01)
*H03M 13/29* (2006.01)

(52) U.S. Cl.
CPC ....... *H04L 5/0053* (2013.01); *H04W 72/1205* (2013.01); *H03M 13/2957* (2013.01); *H04L 1/1812* (2013.01)

(58) Field of Classification Search
CPC ......... H03M 13/2957; H03M 13/6362; H03M 13/1102; H03M 13/13; H03M 13/1515; H03M 13/152; H03M 13/23; H04W 72/1205
See application file for complete search history.

(56) References Cited

U.S. PATENT DOCUMENTS

2007/0041458 A1* 2/2007 Hocevar ............... H04L 1/0041
                                                    375/260
2011/0022926 A1* 1/2011 Hu .................... H03M 13/3905
                                                    714/752
2019/0158222 A1* 5/2019 Kurmaev ............. H04L 1/0058

OTHER PUBLICATIONS

Huawei et al: "On the relationship between re-tuning time and bandwidth reduction", 3GPP Draft; R1-143710, 3rd Generation Partnership Project (3GPP), Mobile Competence Centre; 650, Route Des Lucioles; F-06921 Sophia-Antipolis Cedex; France vol. RAN WG1, No. Ljubljana, Slovenia; Oct. 6, 2014-Oct. 10, 2014 Sep. 27, 2014 (Sep. 27, 2014), XP050869396, 5 pages.
International Search Report and Written Opinion—PCT/US2018/033039—ISA/EPO—Aug. 24, 2018.
NEC: "Details of Retuning Symbols for FeMTC in Rel-14", 3GPP DRAFT; R1-1611717 Details of Retuning Symbols for FEMTC-V1A, 3rd Generation Partnership Project (3GPP), Mobile Competence Centre, 650, Route Des Lucioles, F-06921 Sophia-Antipolis Cedex, France, vol. RAN WG1, No. Reno, USA; Nov. 14, 2016-Nov. 18, 2016 Nov. 13, 2016, XP051175687, Retrieved from the Internet: URL:http://www.3gpp.org/ftp/Meetings_3GPP_SYNC/RAN1/Docs/ [retrieved on Nov. 13, 2016], 2 pages.

* cited by examiner

| MCS | No. of RBs | Symbol Puncturing Pattern | Effective Code Rate After Puncturing |
|---|---|---|---|
| 14 | 3 | 1001 | 0.5333 |
| 14 | 3 | 0011 | 0.5333 |
| 14 | 3 | 1100 | 0.5333 |
| 14 | 3 | 1101 | 0.5926 |
| 14 | 3 | 1011 | 0.5926 |
| 14 | 3 | 1111 | 0.6667 |
| 10 | 5 | 1100 | 0.7467 |
| 10 | 5 | 1101 | 0.8296 |
| 10 | 5 | 1111 | 0.9333 |

| MCS | No. of RBs | TB Size | Symbol Puncturing Pattern | Effective Code Rate After Puncturing | Modified TB Size | Effective Code Rate After Puncturing for Modified TB Size |
|---|---|---|---|---|---|---|
| 14 | 3 | 744 | 1001 | 0.5333 | 760 | 0.5444 |
| 14 | 3 | 744 | 0011 | 0.5333 | 760 | 0.5444 |
| 14 | 3 | 744 | 1100 | 0.5333 | 760 | 0.5444 |
| 14 | 3 | 744 | 1101 | 0.5926 | 760 | .06049 |
| 14 | 3 | 744 | 1011 | 0.5926 | 760 | 0.6049 |
| 14 | 3 | 744 | 1111 | 0.6667 | 760 | 0.6806 |
| 10 | 5 | 872 | 1100 | 0.7467 | 856 | 0.7333 |
| 10 | 5 | 872 | 1101 | 0.8296 | 856 | 0.8148 |
| 10 | 5 | 872 | 1111 | 0.9333 | 856 | 0.9167 |

SYSTEMS AND METHODS FOR MITIGATING DECODING ERRORS DUE TO PUNCTURING OF SYMBOLS

PRIORITY CLAIM

This application claims priority to and the benefit of Indian Application No. 201741018048 filed in the Indian Patent Office on May 23, 2017, the entire content of which is incorporated herein by reference as if fully set forth below in its entirety and for all applicable purposes.

TECHNICAL FIELD

The technology discussed below relates generally to wireless communication systems, and more particularly, to puncturing of symbols within subframes.

INTRODUCTION

In a fourth-generation (4G) wireless communication network that follows standards for an evolved UMTS Terrestrial Radio Access Network (eUTRAN), also commonly known as Long-Term Evolution (LTE)), over-the-air transmissions of information are assigned to various physical channels or signals. Very generally, these physical channels or signals carry traffic and control information. For example, a Physical Downlink Shared Channel (PDSCH) is the main traffic bearing downlink channel, while the Physical Uplink Shared Channel (PUSCH) is the main traffic bearing uplink channel. Similarly, a Physical Downlink Control Channel (PDCCH) carries downlink control information (DCI) providing downlink assignments and/or uplink grants of time-frequency resources to a user equipment (UE) or a group of UEs. In addition, a Physical Uplink Control Channel (PUCCH) carries uplink control information including acknowledgement information, channel quality information, scheduling requests and multiple-input-multiple-output (MIMO) feedback information. These channels and signals are time-divided into frames, and the frames are further subdivided into subframes, time slots, and symbols.

Release 13 of LTE, often referred to as LTE-M, introduced a new UE category for enhanced machine-type communications (eMTC) that supports reduced bandwidth, reduced transmit power, lower data rates, long battery life, and extended coverage operations. These UEs are typically referred to as bandwidth-reduced, low-complexity (BL), coverage enhancement (CE) UE's (or BL/CE UEs). BL/CE UEs may support different narrowbands for uplink transmissions. In some examples, a narrowband refers to a group of six contiguous resource blocks, each including, for example, 12 consecutive sub-carriers in the frequency domain. In some circumstances, a BL/CE UE may utilize different narrowbands in consecutive uplink subframes. For example, a BL/CE UE may transmit a PUCCH or PUSCH within a first narrowband in one subframe and a PUCCH or PUSCH within a second narrowband in the next subframe. In this situation, the BL/CE UE will need to perform frequency retuning from the first narrowband to the second narrowband between the two consecutive uplink subframes.

To accommodate the frequency retuning process, a guard period is typically created between the two consecutive uplink subframes by puncturing one or more symbols at the end of the first subframe and/or the beginning of the next subframe. However, when puncturing PUSCH symbols, decoding errors may occur at the receiver depending on the puncturing pattern utilized. Therefore, mechanisms for mitigating the decoding errors due to PUSCH symbol puncturing continue to be researched and developed for Release 14 of LTE and beyond.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects of the disclosure provide techniques for mitigating the decoding errors observed at the receiver as a result of puncturing symbols between consecutive subframes having the same transmission direction. To reduce the decoding errors, a plurality of transmission options, each including a number of resource blocks and a modulation and coding scheme (MCS), may be identified. In addition, each transmission option may be associated with one or more puncturing patterns that hinder decoding of a codeword at the receiver. The base station or user equipment (UE) may then select or modify at least one aspect of a scheduling decision involving the communication of the codeword in a given subframe of at least two consecutive subframes to minimize decoding errors. For example, a selected puncturing pattern or a transport block size associated with a selected transmission option may be modified.

In some examples, the base station may avoid selecting any of the transmission options and associated puncturing patterns that may hinder decoding at the receiver when rendering the scheduling decision for communication of the codeword in the given subframe. In other examples, the base station may take into account an impact on subframe N−1 when making a scheduling decision on subframe N. For example, the base station may modify a narrowband scheduled for subframe N to match the narrowband scheduled for subframe N−1 to prevent puncturing of the symbols in subframe N−1 and/or subframe N. As another example, the base station may simply cancel scheduling of communication of a codeword in subframe N for the UE.

In some examples, the UE or base station may modify the puncturing pattern to puncture different or fewer symbols within the two consecutive subframes. In other examples, the UE or base station may modify the transport block size as a function of the selected transmission option and puncturing pattern. For example, a transport block size table maintained at the UE or base station may be modified for the problematic transmission options (e.g., number of resource blocks and MCS that may produce decoding errors based on the puncturing pattern).

In other aspects of the disclosure, the base station or UE may utilize a turbo decoder to try different combinations of the punctured bits that result in a cyclic redundancy code (CRC) pass to attempt to decode the punctured subframe(s). The base station or UE may further run a Viterbi algorithm utilizing the tail bits in the trellis termination of the turbo code to obtain the punctured bits that result in the correct termination.

In one aspect of the disclosure, a method of wireless communication at a scheduling entity in a wireless communication network is provided. The method includes identifying a plurality of transmission options, each including a respective number of resource blocks and a respective modulation and coding scheme (MCS). The method further includes identifying respective puncturing patterns associated with each of the plurality of transmission options for at least two consecutive subframes, each having a same transmission direction. The method further includes rendering a scheduling decision for the at least two consecutive subframes based on the plurality of transmission options and the puncturing patterns associated with each of the plurality of transmission options. The scheduling decision includes at least a selected transmission option of the plurality of transmission options for communication of a first codeword between the scheduling entity and a user equipment (UE) in a given subframe of the at least two consecutive subframes. In addition, rendering the scheduling decision further includes selecting at least one aspect of the scheduling decision to reduce decoding errors of the first codeword.

Another aspect of the disclosure provides a scheduling entity in a wireless communication network. The scheduling entity includes a processor, a memory communicatively coupled to the process, and a transceiver communicatively coupled to the processor. The processor is configured to identify a plurality of transmission options, each including a respective number of resource blocks and a respective modulation and coding scheme (MCS). The processor is further configured to identify respective puncturing patterns associated with each of the plurality of transmission options for at least two consecutive subframes, each having a same transmission direction. The processor is configured to render a scheduling decision for the at least two consecutive subframes based on the plurality of transmission options and the puncturing patterns associated with each of the plurality of transmission options. The scheduling decision includes at least a selected transmission option of the plurality of transmission options for communication of a first codeword between the scheduling entity and a user equipment (UE) via the transceiver in a given subframe of the at least two consecutive subframes. The processor is further configured to select at least one aspect of the scheduling decision to reduce decoding errors of the first codeword.

Another aspect of the disclosure provides a method of wireless communication at a scheduled entity in wireless communication with a scheduling entity in a wireless communication network. The method includes identifying a plurality of transmission options, each including a respective number of resource blocks and a respective modulation and coding scheme (MCS). The method further includes identifying respective puncturing patterns associated with each of the plurality of transmission options for at least two consecutive subframes, each having a same transmission direction. The method further includes modifying at least one aspect of a scheduling decision associated with communication of a codeword between the scheduling entity and the scheduled entity in a given subframe of the at least two consecutive subframes utilizing a selected transmission option of the plurality of transmission options to reduce decoding errors of the codeword. The at least one aspect includes at least one of a selected puncturing pattern of the respective puncturing patterns associated with the selected transmission option or a transport block size associated with the codeword.

Another aspect of the disclosure provides user equipment in wireless communication with a scheduling entity within a wireless communication network. The user equipment includes a processor, a memory communicatively coupled to the processor, and a transceiver communicatively coupled to the processor. The processor is configured to identify a plurality of transmission options, each including a respective number of resource blocks and a respective modulation and coding scheme (MCS). The processor is further configured to identify respective puncturing patterns associated with each of the plurality of transmission options for at least two consecutive subframes, each having a same transmission direction. The processor is further configured to modify at least one aspect of a scheduling decision associated with communication of a codeword between the scheduling entity and the scheduled entity via the transceiver in a given subframe of the at least two consecutive subframes utilizing a selected transmission option of the plurality of transmission options to reduce decoding errors of the codeword. The at least one aspect includes at least one of a selected puncturing pattern of the respective puncturing patterns associated with the selected transmission option or a transport block size associated with the codeword.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

FIG. 8 is a table illustrating examples of combinations of MCS index and number of RBs for which a puncturing pattern of PUSCH symbols hinders decoding at the base station, in accordance with aspects of the present disclosure.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes and constitution.

Figure 1:
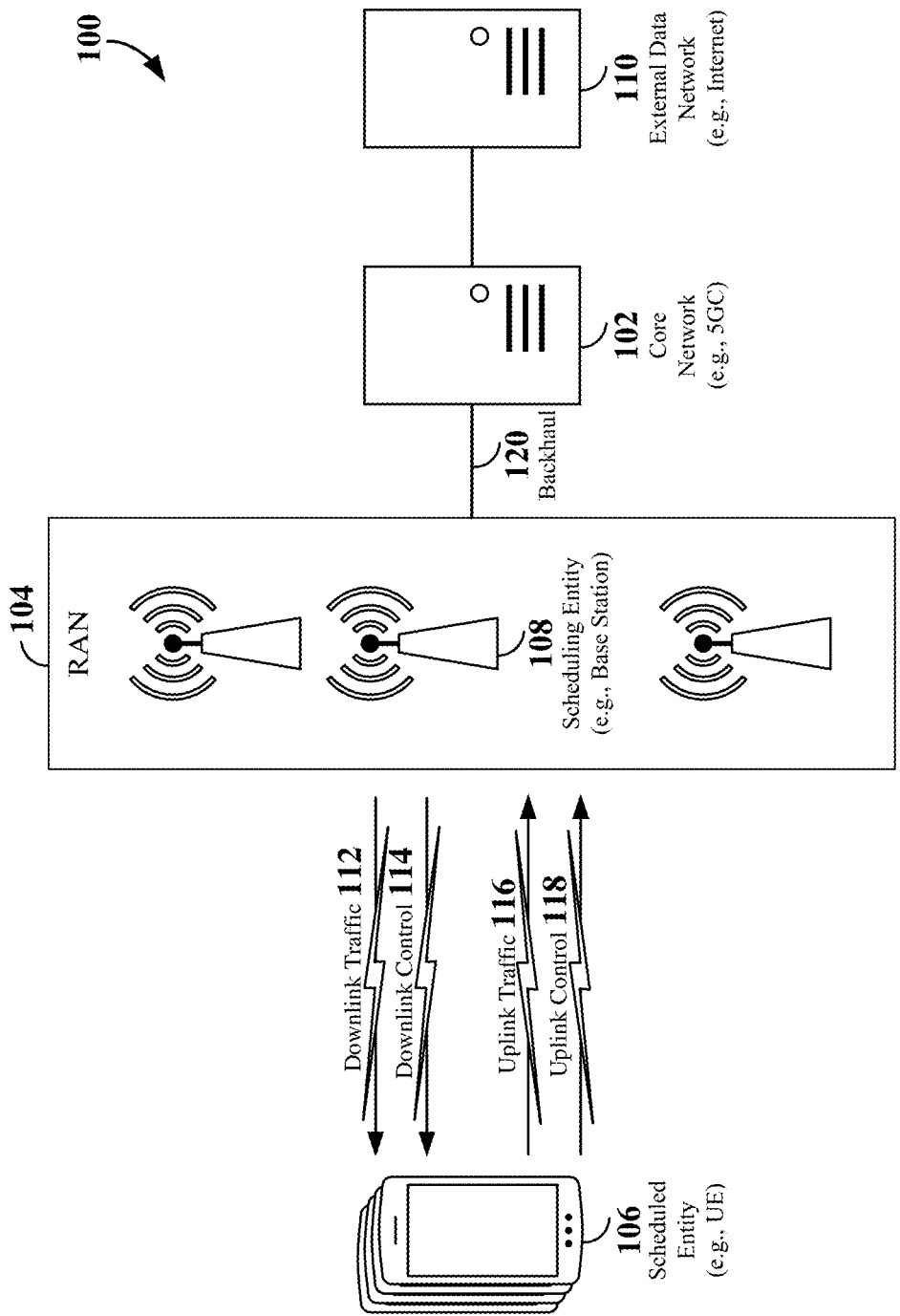
FIG. 1 is a schematic illustration of a wireless communication system.

The various concepts presented throughout this disclosure may be implemented across a broad variety of telecommunication systems, network architectures, and communication standards. Referring now to FIG. 1, as an illustrative example without limitation, various aspects of the present disclosure are illustrated with reference to a wireless communication system 100. The wireless communication system 100 includes three interacting domains: a core network 102, a radio access network (RAN) 104, and a user equipment (UE) 106. By virtue of the wireless communication system 100, the UE 106 may be enabled to carry out data communication with an external data network 110, such as (but not limited to) the Internet.

The RAN 104 may implement any suitable wireless communication technology or technologies to provide radio access to the UE 106. As one example, the RAN 104 may operate according to 3rd Generation Partnership Project (3GPP) Evolved Universal Terrestrial Radio Access Network (eUTRAN) standards, often referred to as Long-Term Evolution (LTE) or 4G. In some examples, the RAN 104 may operate according to Release 13 or later of LTE standards. Of course, many other examples may be utilized within the scope of the present disclosure.

As illustrated, the RAN 104 includes a plurality of base stations 108. Broadly, a base station is a network element in a radio access network responsible for radio transmission and reception in one or more cells to or from a UE. In different technologies, standards, or contexts, a base station may variously be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), or some other suitable terminology.

The radio access network 104 is further illustrated supporting wireless communication for multiple mobile apparatuses. A mobile apparatus may be referred to as user equipment (UE) in 3GPP standards, but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services. In accordance with various aspects of the present disclosure, a UE may further include an enhanced machine-type communications (eMTC) device that supports reduced bandwidth, reduced transmit power, lower data rates, long battery life, and extended coverage operations. These UEs may be referred to herein as bandwidth-reduced, low-complexity (BL), coverage enhancement (CE) UEs (or BUCE UEs).

Within the present document, a "mobile" apparatus need not necessarily have a capability to move, and may be stationary. The term mobile apparatus or mobile device broadly refers to a diverse array of devices and technologies. UEs may include a number of hardware structural components sized, shaped, and arranged to help in communication; such components can include antennas, antenna arrays, RF chains, amplifiers, one or more processors, etc. electrically coupled to each other. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of Things" (IoT). A mobile apparatus may additionally be an automotive or other transportation vehicle, a remote sensor or actuator, a robot or robotics device, a satellite radio, a global positioning system (GPS) device, an object tracking device, a drone, a multicopter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles, aircraft, ships, and weaponry, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

Wireless communication between a RAN 104 and a UE 106 may be described as utilizing an air interface. Transmissions over the air interface from a base station (e.g., base station 108) to one or more UEs (e.g., UE 106) may be referred to as downlink (DL) transmission. In accordance with certain aspects of the present disclosure, the term downlink may refer to a point-to-multipoint transmission originating at a scheduling entity (described further below; e.g., base station 108). Another way to describe this scheme may be to use the term broadcast channel multiplexing. Transmissions from a UE (e.g., UE 106) to a base station (e.g., base station 108) may be referred to as uplink (UL) transmissions. In accordance with further aspects of the present disclosure, the term uplink may refer to a point-to-point transmission originating at a scheduled entity (described further below; e.g., UE 106).

In some examples, access to the air interface may be scheduled, wherein a scheduling entity (e.g., a base station 108) allocates resources for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs 106, which may be scheduled entities, may utilize resources allocated by the scheduling entity 108.

Base stations 108 are not the only entities that may function as scheduling entities. That is, in some examples, a UE may function as a scheduling entity, scheduling resources for one or more scheduled entities (e.g., one or more other UEs).

As illustrated in FIG. 1, a scheduling entity 108 may transmit downlink traffic 112 to one or more scheduled entities 106. Broadly, the scheduling entity 108 is a node or device responsible for scheduling traffic in a wireless communication network, including the downlink traffic 112 and, in some examples, uplink traffic 116 from one or more scheduled entities 106 to the scheduling entity 108. On the other hand, the scheduled entity 106 is a node or device that receives downlink control information 114, including but not limited to scheduling information (e.g., a grant), synchronization or timing information, or other control information from another entity in the wireless communication network such as the scheduling entity 108.

For example, the scheduling entity 108 may transmit control information 114 including one or more control channels, such as a PBCH; a PSS; a SSS; a physical control format indicator channel (PCFICH); a physical hybrid automatic repeat request (HARQ) indicator channel (PHICH); and/or a physical downlink control channel (PDCCH), etc., to one or more scheduled entities 106. The PHICH carries HARQ feedback transmissions such as an acknowledgment (ACK) or negative acknowledgment (NACK). HARQ is a technique well-known to those of ordinary skill in the art, wherein packet transmissions may be checked at the receiving side for accuracy, and if confirmed, an ACK may be transmitted, whereas if not confirmed, a NACK may be transmitted. In response to a NACK, the transmitting device may send a HARQ retransmission, which may implement chase combining, incremental redundancy, etc.

Uplink traffic 116 and/or downlink traffic 112 including one or more traffic channels, such as a physical downlink shared channel (PDSCH) or a physical uplink shared channel (PUSCH) (and, in some examples, system information blocks (SIBs)), may additionally be transmitted between the scheduling entity 108 and the scheduled entities 106. Furthermore, the scheduled entities 106 may transmit uplink control information 118 including one or more uplink control channels, such as a physical uplink control channel (PUCCH), to the scheduling entity 108. Uplink control information may include a variety of packet types and categories, including pilots, reference signals, and information configured to enable or assist in decoding uplink traffic transmissions. In some examples, the uplink control information 118 may include a scheduling request (SR), i.e., request for the scheduling entity 108 to schedule an uplink packet transmission for a scheduled entity 106. Here, in response to the SR transmitted on an uplink control channel 118, the scheduling entity 108 may transmit downlink control information 114 to the scheduled entity 106 that may schedule the uplink packet transmission.

In addition, the uplink and/or downlink control information and/or traffic information may be time-divided into frames, subframes, time slots, and/or symbols. As used herein, a symbol may refer to a unit of time that, in an orthogonal frequency division multiplexed (OFDM) waveform, carries one resource element (RE) per sub-carrier. A time slot may carry 7 OFDM symbols with normal cyclic prefix (CP). A subframe may refer to a duration of 1 ms, and in some examples, may include two time slots. Multiple subframes may be grouped together to form a single frame or radio frame. For example, a frame may include ten equally sized subframes. Of course, these definitions are not required, and any suitable scheme for organizing waveforms may be utilized, and various time divisions of the waveform may have any suitable duration.

In general, base stations 108 may include a backhaul interface for communication with a backhaul portion 120 of the wireless communication system. The backhaul 120 may provide a link between a base station 108 and the core network 102. Further, in some examples, a backhaul network may provide interconnection between the respective base stations 108. Various types of backhaul interfaces may be employed, such as a direct physical connection, a virtual network, or the like using any suitable transport network.

The core network 102 may be a part of the wireless communication system 100, and may be independent of the radio access technology used in the RAN 104. In some examples, the core network 102 may be configured according to a 4G evolved packet core (EPC), or any other suitable standard or configuration.

Figure 2:
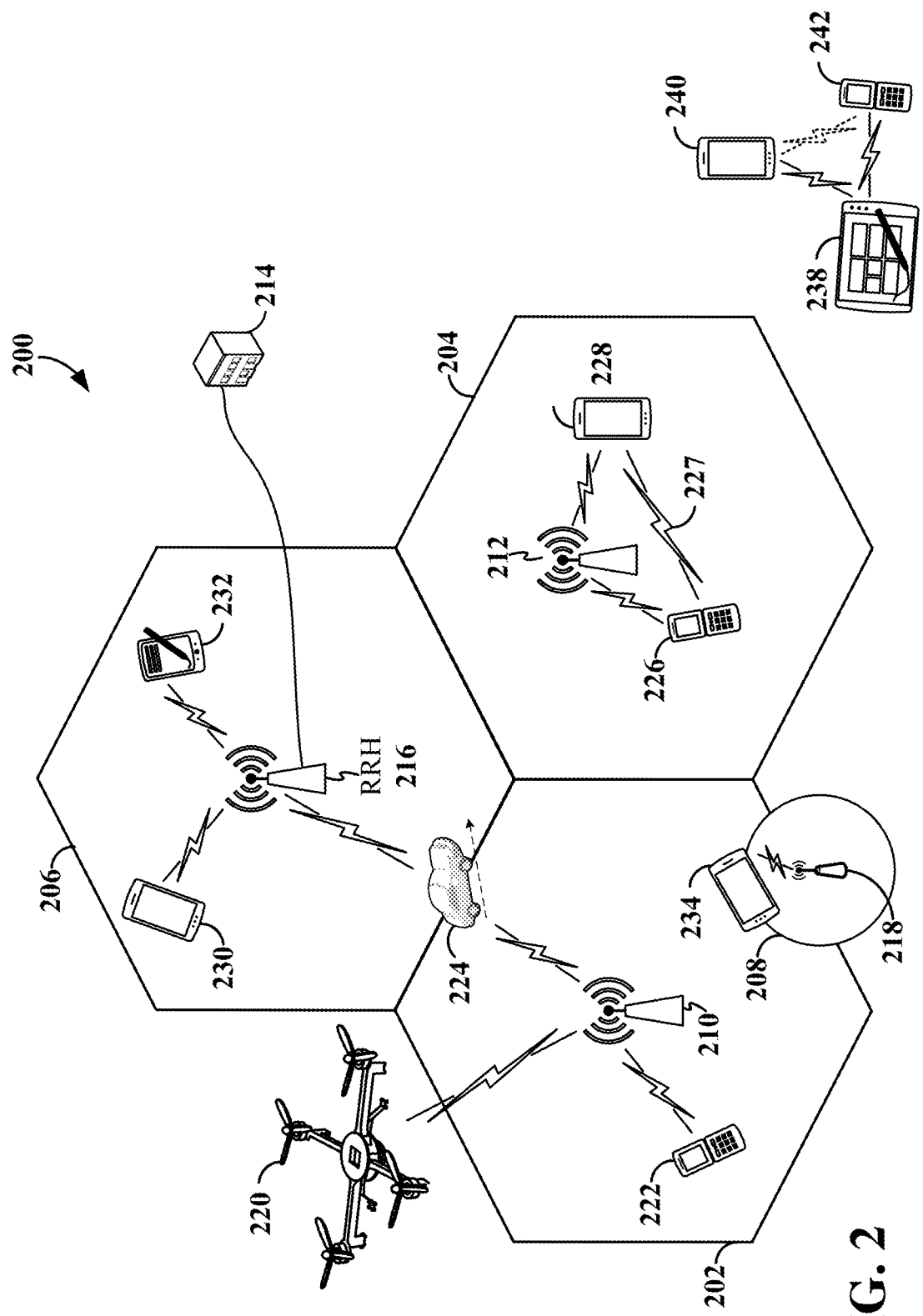
FIG. 2 is a conceptual illustration of an example of a radio access network.

Referring now to FIG. 2, by way of example and without limitation, a schematic illustration of a RAN 200 is provided. In some examples, the RAN 200 may be the same as the RAN 104 described above and illustrated in FIG. 1. The geographic area covered by the RAN 200 may be divided into cellular regions (cells) that can be uniquely identified by a user equipment (UE) based on an identification broadcasted from one access point or base station. FIG. 2 illustrates macrocells 202, 204, and 206, and a small cell 208, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In FIG. 2, two base stations 210 and 212 are shown in cells 202 and 204; and a third base station 214 is shown controlling a remote radio head (RRH) 216 in cell 206. That is, a base station can have an integrated antenna or can be connected to an antenna or RRH by feeder cables. In the illustrated example, the cells 202, 204, and 126 may be referred to as macrocells, as the base stations 210, 212, and 214 support cells having a large size. Further, a base station 218 is shown in the small cell 208 (e.g., a microcell, picocell, femtocell, home base station, home Node B, home eNode B, etc.) which may overlap with one or more macrocells. In this example, the cell 208 may be referred to as a small cell, as the base station 218 supports a cell having a relatively small size. Cell sizing can be done according to system design as well as component constraints.

It is to be understood that the radio access network 200 may include any number of wireless base stations and cells. Further, a relay node may be deployed to extend the size or coverage area of a given cell. The base stations 210, 212, 214, 218 provide wireless access points to a core network for any number of mobile apparatuses. In some examples, the base stations 210, 212, 214, and/or 218 may be the same as the base station/scheduling entity 108 described above and illustrated in FIG. 1.

Within the RAN 200, the cells may include UEs that may be in communication with one or more sectors of each cell. Further, each base station 210, 212, 214, and 218 may be configured to provide an access point to a core network 102 (see FIG. 1) for all the UEs in the respective cells. For example, UEs 222 and 224 may be in communication with base station 210; UEs 226 and 228 may be in communication with base station 212; UEs 230 and 232 may be in communication with base station 214 by way of RRH 216; and UE 234 may be in communication with base station 218. In some examples, the UEs 222, 224, 226, 228, 230, 232, 234, 238, 240, and/or 242 may be the same as the UE/scheduled entity 106 described above and illustrated in FIG. 1.

In some examples, an unmanned aerial vehicle (UAV) 220, which may be a drone or quadcopter, can be a mobile network node and may be configured to function as a UE. For example, the UAV 220 may operate within cell 202 by communicating with base station 210.

In a further aspect of the RAN 200, sidelink signals may be used between UEs without necessarily relying on scheduling or control information from a base station. For example, two or more UEs (e.g., UEs 226 and 228) may communicate with each other using peer to peer (P2P) or sidelink signals 227 without relaying that communication through a base station (e.g., base station 212). In a further example, UE 238 is illustrated communicating with UEs 240 and 242. Here, the UE 238 may function as a scheduling entity or a primary sidelink device, and UEs 240 and 242 may function as a scheduled entity or a non-primary (e.g., secondary) sidelink device.

In the radio access network 200, the ability for a UE to communicate while moving, independent of its location, is referred to as mobility. The various physical channels between the UE and the radio access network are generally set up, maintained, and released under the control of a mobility management entity (MME). In various aspects of the disclosure, a radio access network 200 may utilize DL-based mobility to enable mobility and handovers (i.e., the transfer of a UE's connection from one radio channel to another). In a network configured for DL-based mobility, during a call with a scheduling entity, or at any other time, a UE may monitor various parameters of the signal from its serving cell as well as various parameters of neighboring cells. Depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 224 (illustrated as a vehicle, although any suitable form of UE may be used) may move from the geographic area corresponding to its serving cell 202 to the geographic area corresponding to a neighbor cell 206. When the signal strength or quality from the neighbor cell 206 exceeds that of its serving cell 202 for a given amount of time, the UE 224 may transmit a reporting message to its serving base station 210 indicating this condition. In response, the UE 224 may receive a handover command, and the UE may undergo a handover to the cell 206.

In various implementations, the air interface in the radio access network 200 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

The air interface in the radio access network 200 may utilize one or more multiplexing and multiple access algorithms to enable simultaneous communication of the various devices. For example, multiple access for UL transmissions from UEs 222 and 224 to base station 210 may be provided utilizing time division multiple access (TDMA), code division multiple access (CDMA), frequency division multiple access (FDMA), orthogonal frequency division multiple access (OFDMA), sparse code multiple access (SCMA), single-carrier frequency division multiple access (SC-FDMA), resource spread multiple access (RSMA), or other suitable multiple access schemes. Further, multiplexing DL transmissions from the base station 210 to UEs 222 and 224 may be provided utilizing time division multiplexing (TDM), code division multiplexing (CDM), frequency division multiplexing (FDM), orthogonal frequency division multiplexing (OFDM), sparse code multiplexing (SCM), single-carrier frequency division multiplexing (SC-FDM), or other suitable multiplexing schemes.

The air interface in the radio access network 200 may further utilize one or more duplexing algorithms Duplex refers to a point-to-point communication link where both endpoints can communicate with one another in both directions. Full duplex means both endpoints can simultaneously communicate with one another. Half duplex means only one endpoint can send information to the other at a time. In a wireless link, a full duplex channel generally relies on physical isolation of a transmitter and receiver, and suitable interference cancellation technologies. Full duplex emulation is frequently implemented for wireless links by utilizing frequency division duplex (FDD) or time division duplex (TDD). In FDD, transmissions in different directions operate at different carrier frequencies. In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per slot.

In order for transmissions over the radio access network 200 to obtain a low block error rate (BLER) while still achieving very high data rates, channel coding may be used. That is, wireless communication may generally utilize a suitable error correcting code. In a typical error correcting code, an encoder (e.g., a CODEC) at the transmitting device mathematically adds redundancy to an information message. Exploitation of this redundancy in the encoded information message can improve the reliability of the message, enabling correction for any bit errors that may occur due to the noise.

Figure 3:
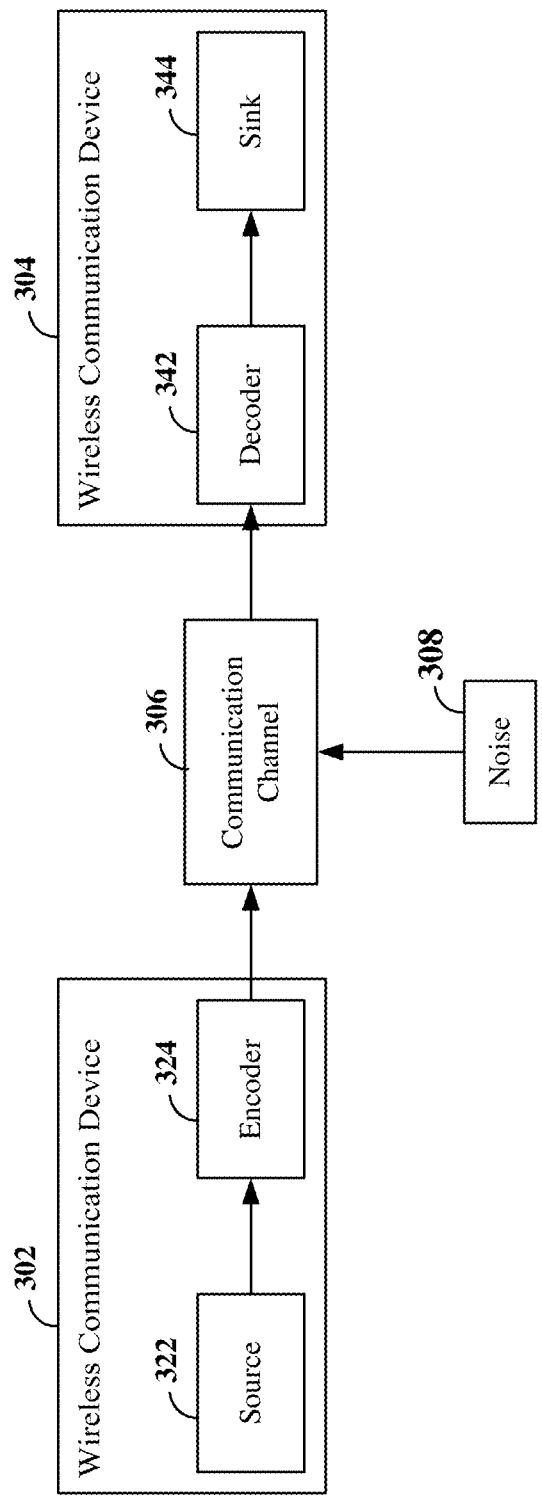
FIG. 3 is a schematic illustration of wireless communication between a first wireless communication device and a second wireless communication device.

FIG. 3 is a schematic illustration of wireless communication between a first wireless communication device 302 and a second wireless communication device 304. Each wireless communication device 302 and 304 may be a user equipment (UE), a base station, or any other suitable apparatus or means for wireless communication. In the illustrated example, a source 322 within the first wireless communication device 302 transmits a digital message over a communication channel 306 (e.g., a wireless channel) to a sink 344 in the second wireless communication device 304. One issue in such a scheme that must be addressed to provide for reliable communication of the digital message, is to take into account the noise 308 that affects the communication channel 306.

Error correcting codes are frequently used to provide reliable transmission of digital messages over such noisy channels. Examples of error correcting codes include block codes and convolutional codes. Convolutional codes convert the entire information message or sequence into a single codeword or code block, where the encoded bits depend not only on current information bits in the information message, but also on past information bits in the information message, thus providing redundancy.

For example, an encoder 324 at the first (transmitting) wireless communication device 302 may use a sliding window to calculate parity bits by combining various subsets of the information bits in the window. The calculated parity bits may then be transmitted over the channel. Exploitation of the redundancy provided by the parity bits is the key to reliability of the message, enabling correction for any bit errors that may occur due to the noise. As an example, if a convolutional code produces r parity bits per window and slides the window forward by one bit at a time, its rate is 1/r. Since the parity bits are the only bits transmitted, the greater the value of r, the greater the resilience to bit errors. That is, a decoder 342 at the second (receiving) wireless communication device 304 can take advantage of the redundancy provided by the parity bits to reliably recover the information message even though bit errors may occur, in part, due to the addition of noise 308 to the channel.

Block codes split the information message up into blocks, each block having a length of K information bits. The encoder 324 at the first (transmitting) wireless communication device 302 then mathematically adds redundancy (e.g., parity bits) to the information message, resulting in codewords or code blocks having a length of N, where N>K. Here, the code rate R is the ratio between the message length and the block length: i.e., R=K/N. Thus, with block codes, the information bits are transmitted together with the parity bits. That is, the decoder 342 at the second (receiving) wireless communication device 304 can take advantage of the redundancy provided by the parity bits to reliably recover the information message even though bit errors may occur, in part, due to the addition of noise 308 to the channel.

Many examples of such error correcting block codes are known to those of ordinary skill in the art, including Hamming codes, Bose-Chaudhuri-Hocquenghem (BCH) codes, turbo codes, polar codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes.

Turbo codes are a class of convolutional codes that appear similar to linear block codes. A turbo code includes a parallel concatenation of a number of recursive systematic convolutional (RSC) coders. Typically, the number of RSC coders is kept low (e.g., two) to maximize the performance, while minimizing the complexity. An RSC coder takes as input systematic (information) bits x and outputs the systematic bits x and parity bits $p_1$. The parity bits $p_1$ are generated by combining various subsets of the systematic bits in the sliding window and folding back one of the output sequences to the coder input, thus making the coder recursive. When using two RSC coders for a turbo encoder 324, the input to the second RSC coder is typically an interleaved version of the systematic bits x, thus producing a second set of parity bits $p_2$. The two sets of parity bits $p_1$ and $p_2$ may thus be considered time displaced codes generated from the same input sequence x. The output of the turbo encoder 324 is then the systematic bits x, multiplexed together with the two sets of parity bits $p_1$ and $p_2$.

At the receiving wireless communication device 304, the signal is demodulated with its associated noise and a soft output for each bit may be provided to a turbo decoder 342. The soft output is typically the log likelihood ratio (LLR), which is a measure of the probability that, given a received soft input y', the message bit $m_i$ associated with a transition in the trellis is 1 or 0. If it is equiprobable that the message bit is a 1 or 0, then the LLR is 0.

The soft values of the information sequence x', and the soft values of the parity bits $p_1'$ and $p_2'$ may be utilized to initialize the turbo decoder 342, which typically includes two decoders. The soft values of parity bits $p_1'$ and $p_2'$ may be interleaved and provided to the second decoder, while the soft values of the information sequence x' may be provided to the first decoder. The sequence derived by the first decoder may be interleaved and presented to the second decoder. This re-sequences bits from streams x' and p', so that bits generated from the same bit in x may be presented simultaneously to the second decoder, whether from x', $p_1'$ or $p_2'$.

In some examples, the decoder 342 may have some knowledge of the probability of the transmitted signal (e.g., the decoder 342 may know that some information messages are more likely than others). This a priori information may assist the turbo decoder 342 in forming the a posteriori output, which represents a best estimate of the received information sequence x. The a posteriori output is then de-interleaved and presented back to the first decoder. Further iterations through the first decoder, interleaver, second decoder, and de-interleaver may refine the estimate until a final version of the information sequence is presented at the output.

The two main types of decoding algorithms utilized by the first and second decoders include the Bahl-Cocke-Jelinek-Raviv (BCJR) decoding algorithm, which is a maximum a posteriori (MAP) algorithm, and the soft output Viterbi algorithm (SOYA). In general, the MAP algorithm attempts to estimate the most likely symbol received, while SOYA attempts to estimate the most likely sequence. For example, the MAP algorithm estimates the most probable value for each received bit by calculating the conditional probability of the transition from the previous bit, given the probability of the received bit (e.g., as determined by the computed LLR). SOYA is similar to the standard Viterbi algorithm in that SOYA utilizes a trellis to establish a surviving path, but unlike the standard Viterbi algorithm, SOYA compares the surviving path sequence to the sequences used to establish non-surviving paths to determine the likelihood of the surviving path sequence. After a prescribed number of iterations, the sequence with the maximum likelihood is output from the turbo decoder 342.

Figure 4:
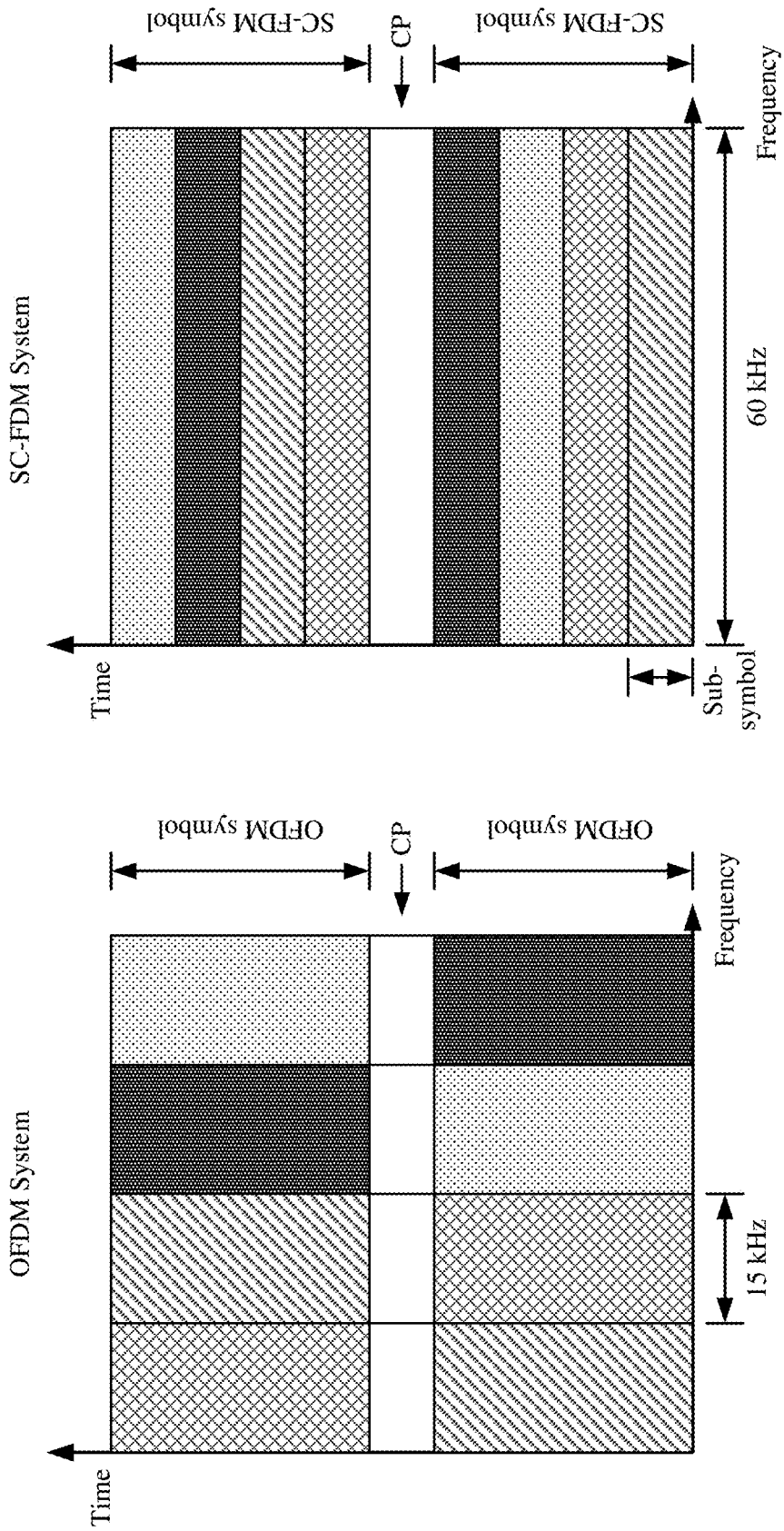
FIG. 4 is a schematic illustration of a comparison of orthogonal frequency division multiplexing (OFDM) and single-carrier frequency division multiplexing (SC-FDM) as may be implemented within a radio access network.

FIG. 4 is a schematic illustration of a comparison of orthogonal frequency division multiplexing (OFDM) and single-carrier frequency division multiplexing (SC-FDM) as may be implemented within a radio access network, such as the RAN 200 illustrated in FIG. 2. In some examples, this illustration may represent wireless resources as they may be allocated in an OFDM or SC-FDM system.

In an OFDM system, a two-dimensional grid of resource elements (REs) may be defined by separation of frequency resources into closely spaced narrowband frequency tones or sub-carriers, and separation of time resources into a sequence of OFDM symbols having a given duration. In the example shown in FIG. 4, each RE is represented by a rectangle having the dimensions of one sub-carrier (e.g., 15 kHz bandwidth) by one OFDM symbol.

Thus, each RE represents a sub-carrier modulated for the OFDM symbol period by one OFDM data symbol. Each OFDM symbol may be modulated using, for example, quadrature phase shift keying (QPSK), 16 quadrature amplitude modulation (QAM) or 64 QAM. For simplicity, only four sub-carriers over two OFDM symbol periods are illustrated. However, it should be understood that any number of sub-carriers and OFDM symbol periods may be utilized within a subframe. For example, in LTE networks, a subframe includes two time slots, each including multiple resource blocks (RBs). A resource block (RB) represents the smallest unit of resources that may be allocated to a user equipment (UE). Each of the RBs is 180 kHz wide in frequency and one time slot long in time. For example, each RB may include 12 consecutive sub-carriers in the frequency domain and, for a normal cyclic prefix in each OFDM symbol, 7 consecutive OFDM symbols in the time domain, or 84 resource elements.

After each OFDM symbol period, respective cyclic prefixes (CPs) may be inserted for each sub-carrier and the next four OFDM symbols may be transmitted in parallel. The CP operates as a guard band between OFDM symbols and is typically generated by copying a small part of the end of an OFDM symbol to the beginning of the OFDM symbol.

By setting the spacing between the tones based on the symbol rate, inter-symbol interference can be eliminated. OFDM channels support high data rates by allocating a data stream in a parallel manner across multiple sub-carriers. However, OFDM suffers from high peak-to-average power ratio (PAPR), which can make OFDM undesirable on the uplink, where UE (scheduled entity) transmit power efficiency and amplifier cost are important factors.

In an SC-FDM system, a two-dimensional grid of resource elements (REs) may be defined by utilizing a wider bandwidth single carrier frequency, and separating the time resources into a sequence of SC-FDM symbols having a given duration. In the example shown in FIG. 4, a 60 kHz carrier is shown corresponding to the four 15 kHz sub-carriers in the OFDM system. In addition, although the OFDM and SC-FDM symbols have the same duration, each SC-FDM symbol contains N "Sub-Symbols" that represent the modulated data symbols. Thus, in the example shown in FIG. 4 with four modulated data symbols, in the OFDM system, the four modulated data symbols are transmitted in parallel (one per sub-carrier), while in the SC-FDM system, the four modulated data symbols are transmitted in series at four times the rate, with each data symbol occupying 4×15 kHz bandwidth. Thus, each RE in the SC-FDM system represents the single carrier frequency modulated for the Sub-Symbol period by one SC-FDM data symbol.

By transmitting the N data symbols in series at N times the rate, the SC-FDM bandwidth is the same as the multi-carrier OFDM system; however, the PAPR is greatly reduced. In general, as the number of sub-carriers increases, the PAPR of the OFDM system approaches Gaussian noise statistics, but regardless of the number of sub-carriers, the SC-FDM PAPR remains substantially the same. Thus, SC-FDM may provide benefits on the uplink by increasing the transmit power efficiency and reducing the power amplifier cost.

Figure 5:
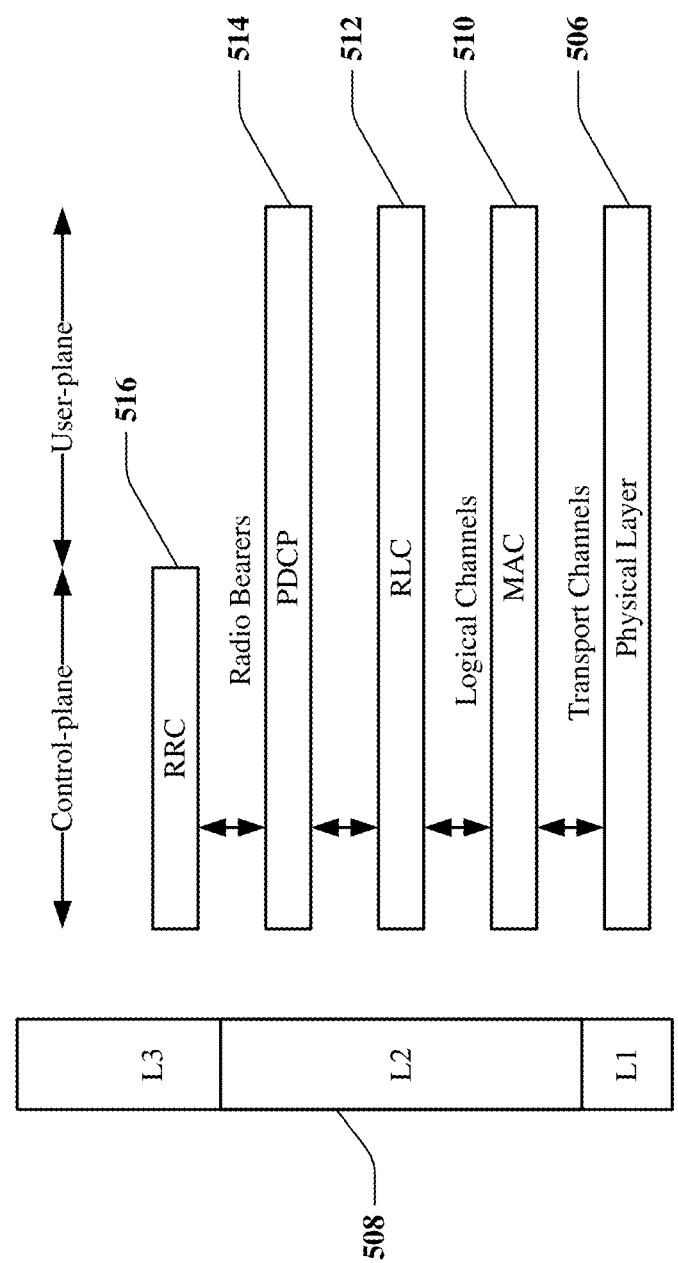
FIG. 5 is a conceptual diagram illustrating an example of a radio protocol architecture for the user and control planes.

The radio protocol architecture for a radio access network, such as the radio access network 200 shown in FIG. 2, may take on various forms depending on the particular application. An example for a 4G radio access network will now be presented with reference to FIG. 5. FIG. 5 is a conceptual diagram illustrating an example of the radio protocol architecture for the user and control planes.

Turning to FIG. 5, the radio protocol architecture for the UE and the eNB is shown with three layers: Layer 1, Layer 2, and Layer 3. Layer 1 is the lowest layer and implements various physical layer signal processing functions. Layer 1 will be referred to herein as the physical layer 506. Layer 2 (L2 layer) 508 is above the physical layer 506 and is responsible for the link between the UE and eNB over the physical layer 506.

In the user plane, the L2 layer 508 includes a media access control (MAC) sublayer 510, a radio link control (RLC) sublayer 512, and a packet data convergence protocol (PDCP) 514 sublayer, which are terminated at the eNB on the network side. Although not shown, the UE may have several upper layers above the L2 layer 508 including a network layer (e.g., IP layer) that is terminated at the Packet Data Network (PDN) gateway on the network side, and an application layer that is terminated at the other end of the connection (e.g., far end UE, server, etc.).

The PDCP sublayer 514 provides multiplexing between different radio bearers and logical channels. The PDCP sublayer 514 also provides header compression for upper layer data packets to reduce radio transmission overhead, security by ciphering the data packets, and handover support for UEs between eNBs. The RLC sublayer 512 provides segmentation and reassembly of upper layer data packets, retransmission of lost data packets, and reordering of data packets to compensate for out-of-order reception due to hybrid automatic repeat request (HARQ). The MAC sublayer 510 provides multiplexing between logical and transport channels. The MAC sublayer 510 is also responsible for allocating the various radio resources (e.g., resource blocks) in one cell among the UEs. The MAC sublayer 510 is also responsible for HARQ operations. The physical sublayer 506 is responsible for transmitting and receiving data on physical channels (e.g., within time slots of subframes).

In the control plane, the radio protocol architecture for the UE and eNB is substantially the same for the physical layer 506 and the L2 layer 508 with the exception that there is no header compression function for the control plane. The control plane also includes a radio resource control (RRC) sublayer 516 in Layer 3. The RRC sublayer 516 is responsible for obtaining radio resources (i.e., radio bearers) and for configuring the lower layers using RRC signaling between the eNB and the UE.

In general, packets received by a sublayer from another sublayer may be referred to as Service Data Units (SDUs), while packets output from a sublayer to another sublayer may be referred to as Protocol Data Units (PDUs). For example, packets received by the PDCP sublayer from an upper layer may be referred to as PDCP SDUs, and packets output from the PDCP sublayer to the RLC sublayer or MAC sublayer may be referred to as PDCP PDUs or RLC/MAC SDUs.

As indicated above, the MAC sublayer 510 may multiplex data from multiple logical channels (e.g., data from multiple PDCP PDUs), onto transport channels for transmission within a single MAC PDU. Thus, each MAC PDU corresponds to one Transport Block (TB) and may include a plurality of multiplexed logical channel MAC SDUs. The physical layer 506 may then encode the transport block into a codeword and covert each codeword into modulation symbols (e.g., OFDM or SC-FDM symbols) for transmission to a receiving wireless communication device.

Figure 6:
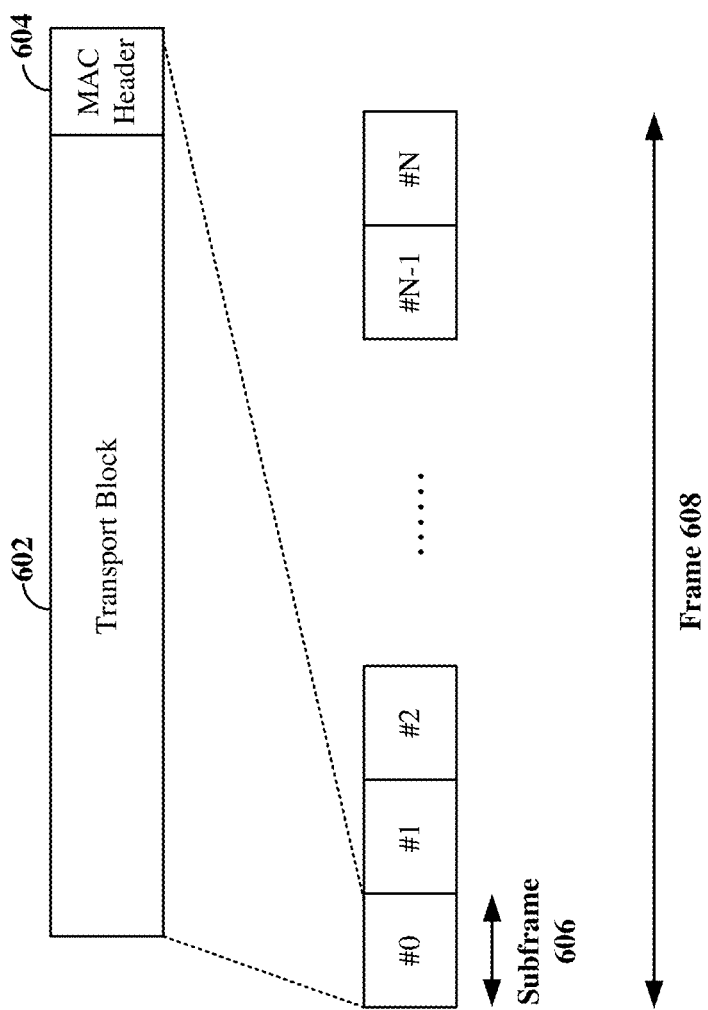
FIG. 6 is a conceptual diagram illustrating the transmission of a transport block within a frame.

FIG. 6 is a conceptual diagram illustrating the transmission of a transport block 602 within a frame 608 according to some embodiments. As indicated above, a transport block 602 includes a plurality of information bits passed to the physical layer from the MAC sublayer. For example, the MAC sublayer may concatenate one or more MAC SDUs into a single Transport Block (TB) 602 and append a MAC header 604 to the TB 602. The MAC sublayer may further configure the physical sublayer to transmit the TB 602 within a subframe 606 of a frame 608. Additional TBs (not shown) may further be mapped to the same subframe (depending on the number of RBs assigned) or other subframes 606 within the frame 608 for transmission of the additional transport blocks between the base station and one or more UEs on the downlink or uplink. The transport block 602 may be encoded into a codeword and then converted into modulation symbols (e.g., OFDM symbols or SC-FDM symbols) for transmission in the subframe 606.

In some examples, each subframe 606 may include a plurality of resource blocks (RBs), each containing either a suitable number of sub-carriers and OFDM symbols or a single carrier and a suitable number of SC-FDM symbols. The number of bits carried by each resource element in a resource block depends on the modulation and coding scheme (MCS). Thus, the number of bits included in the TB 602 (e.g., the transport block size) depends on the MCS and the number of resource blocks assigned to the UE. The transport block size (TBS) for each combination of number of RBs and MCS may be maintained, for example, in a TBS table within the base station and UE.

For FDD, uplink and downlink frames are separated by frequency and transmitted continuously and synchronously. For TDD, uplink and downlink subframes are transmitted on the same frequency and multiplexed in the time domain. For example, in FIG. 6, the first subframe (subframe #0) may be a downlink subframe, while the next two subframes (e.g., subframe #1 and subframe #2) may be uplink subframes.

In some examples, a UE may be assigned different narrowbands within two consecutive uplink subframes (e.g., subframe #1 and subframe #2) in a TDD or FDD system. As used herein, the term narrowband is defined as a group of six contiguous resource blocks. For example, a UE may be assigned a first narrowband frequency (e.g., a first carrier) within a first uplink subframe (subframe #1) and a second narrowband frequency (e.g., a second carrier) within a second uplink subframe (subframe #2).

As an example, for Release 13 and Release 14 of LTE, bandwidth-reduced, low-complexity (BL), coverage enhancement (CE) UEs (or BL/CE UEs) may support different narrowband frequencies for uplink transmissions. For example, a BL/CE UE may transmit a PUCCH or PUSCH within a first narrowband in one subframe (e.g., subframe #1) and a PUCCH or PUSCH within a second narrowband in the next subframe (e.g., subframe #2). In this situation, the BL/CE UE will need to perform frequency retuning from the first narrowband to the second narrowband between the two consecutive uplink subframes.

Figure 7:
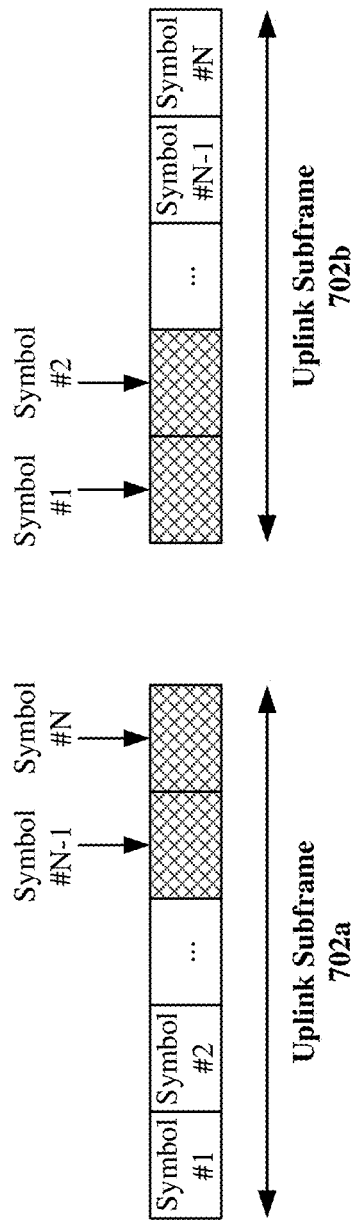
FIG. 7 is a conceptual diagram illustrating two consecutive uplink subframes implementing a guard period for frequency retuning between the subframes, in accordance with aspects of the present disclosure.

To accommodate the frequency retuning process, a guard period is typically created between the two consecutive uplink subframes by puncturing one or more SC-FDM symbols (e.g., each corresponding to an SC-FDM Sub-Symbol shown in FIG. 4) at the end of the first subframe and/or the beginning of the next subframe. FIG. 7 is a conceptual diagram illustrating two consecutive uplink subframes 702*a* and 702*b* implementing a guard period for frequency retuning between the subframes 702*a* and 70*b*. Each subframe 702*a* and 702*b* includes a plurality of SC-FDM symbols (Symbol #1, Symbol #2, . . . , Symbol #N−1, Symbol #N). The guard period may be created by puncturing the last symbol or the last two symbols (Symbol #N or Symbol #N and Symbol #N−1) in the first subframe 702*a* and/or puncturing the first symbol or the first two symbols (Symbol #1 or Symbol #1 and Symbol #2) in the second subframe 702*b*.

For example, if the BL/CE UE retunes from a first narrowband carrying PUSCH to a second narrowband carrying PUSCH or from a first narrowband carrying PUCCH to a second narrowband carrying PUCCH, the guard period may be created by puncturing the last SC-FDM symbol (Symbol #N) in the first subframe 702*a* and the first SC-FDM symbol (Symbol #1) in the second subframe 702*b*. In addition, if the BL/CE UE retunes from a first narrowband carrying PUCCH to a second narrowband carrying PUSCH, the guard period may be created by puncturing the first SC-FDM symbol (Symbol #1) in the second subframe 702*b* (e.g., if a shortened PUCCH format is utilized) or the first two SC-FDM symbols (Symbol #1 and Symbol #2) in the second subframe 702*b* (e.g., if a regular PUCCH format is utilized). Furthermore, if the BL/CE UE retunes from a first narrowband carrying PUSCH to a second narrowband carrying PUCCH, the guard period may be created by puncturing the last two SC-FDM symbols (Symbol #N−1 and Symbol #N) in the first subframe 702*a*. In each of the above examples, the punctured PUSCH symbols are counted in the PUSCH mapping, but not used for transmission of the PUSCH.

However, when puncturing PUSCH SC-FDM symbols, decoding errors may occur depending on the puncturing pattern utilized. For example, the tones carrying different systematic, parity 1 and parity 2 bits of the turbo code may be lost. As a result, for different numbers of resource blocks and modulation and coding schemes, the log likelihood ratios (LLRs) for some of the systematic bits at the output of the turbo decoder running the BCJR algorithm (MAP algorithm) may converge to zero, even an infinite signal-to-noise ratio (SNR).

FIG. 8 is a table 800 illustrating examples of combinations of MCS/number of RBs for which a puncturing pattern of PUSCH symbols hinders decoding at the base station. Each puncturing pattern is for a given (single) subframe, where the first two bits in the puncturing pattern represent the first PUSCH symbol and the second PUSCH symbol (e.g., Symbol #1 and Symbol #2 shown in FIG. 7) and the last two bits in the puncturing pattern represent the second to last PUSCH symbol and the last PUSCH symbol (e.g., Symbol #N−1 and Symbol #N shown in FIG. 7). Thus, in some examples, the puncturing pattern may represent a part of a first overall puncturing pattern between the given uplink subframe and a previous subframe and a part of a second overall puncturing pattern between the given uplink subframe and a subsequent subframe. As indicated above in reference to FIG. 7, in order to puncture the second symbol, the first symbol must also be punctured (e.g., either the first symbol or the first and second symbols may be punctured). Similarly, in order to puncture the second to last symbol, the last symbol must also be punctured (e.g., either the last symbol or the last and second to last symbols may be punctured).

Each combination of MCS index and number of RBs may be referred to herein as a transmission option. As can be seen in FIG. 8, for the transmission option corresponding to an MCS index of 14 with three RBs being assigned to a UE, six out of the eight possible puncturing patterns are problematic. The only puncturing patterns that do not hinder decoding at the base station are the 0001 puncturing pattern and the 1000 puncturing pattern. For the transmission option corresponding to an MCS index of 10 with five RBs being assigned to the UE, three of the eight possible puncturing patterns are problematic. It should be understood that the list of transmission options and puncturing patterns shown in FIG. 8 is merely illustrative, and other transmission options and puncturing patterns may also hinder decoding at the base station.

FIG. 8 further illustrates the effective code rate for each transmission option and puncturing pattern. Although the effective code rates listed are higher than the code rates without puncturing, decoding at the base station should still be possible for at least some of the transmission options and number of punctured symbols based on the effective code rates. However, due to the particular puncturing patterns utilized, decoding at the base station may fail.

Therefore, various aspects of the present disclosure provide mechanisms for mitigating the decoding errors due to symbol puncturing in a subframe of two or more consecutive subframes having the same transmission direction. In some examples, the symbols that are punctured are physical uplink shared channel (PUSCH) symbols to provide a guard period between consecutive uplink subframes utilizing different narrowband frequencies. In other examples, the symbols that are punctured may be other channel symbols, such as physical downlink shared channel (PSDCH) symbols to provide a guard period between consecutive downlink subframes utilizing different narrowband frequencies.

In some examples, to mitigate the decoding errors, the base station or user equipment (UE) may select or modify at least one aspect of a scheduling decision involving the communication of a codeword in a given subframe of at least two consecutive subframes to minimize decoding errors. For example, a selected puncturing pattern or a transport block size associated with a selected transmission option may be modified.

In some examples, the base station may avoid selecting any of the transmission options and associated puncturing patterns that may hinder decoding at the receiver when rendering the scheduling decision for communication of the codeword in the given subframe. In other examples, the base station may take into account an impact on subframe N−1 when making a scheduling decision on subframe N. For example, the base station may modify a narrowband scheduled for subframe N to match the narrowband scheduled for subframe N−1 to prevent puncturing of the symbols in subframe N−1 and/or subframe N. As another example, the base station may simply cancel scheduling of a codeword in subframe N for the UE.

In some examples, the UE or base station may modify the puncturing pattern to puncture different symbols or fewer symbols within the two consecutive subframes. In other examples, the UE or base station may modify the transport block size as a function of the selected transmission option and puncturing pattern. For example, a transport block size table maintained at the UE or base station may be modified for the problematic transmission options (e.g., number of resource blocks and MCS that may produce decoding errors based on the puncturing pattern).

In other aspects of the disclosure, the base station or UE may utilize a turbo decoder to try different combinations of the punctured bits that result in a cyclic redundancy code (CRC) pass to attempt to decode the punctured subframe(s). The base station or UE may further run a Viterbi algorithm, possibly also utilizing the tail bits in the trellis termination of the turbo code to obtain the punctured bits that result in a CRC pass.

Figure 9:
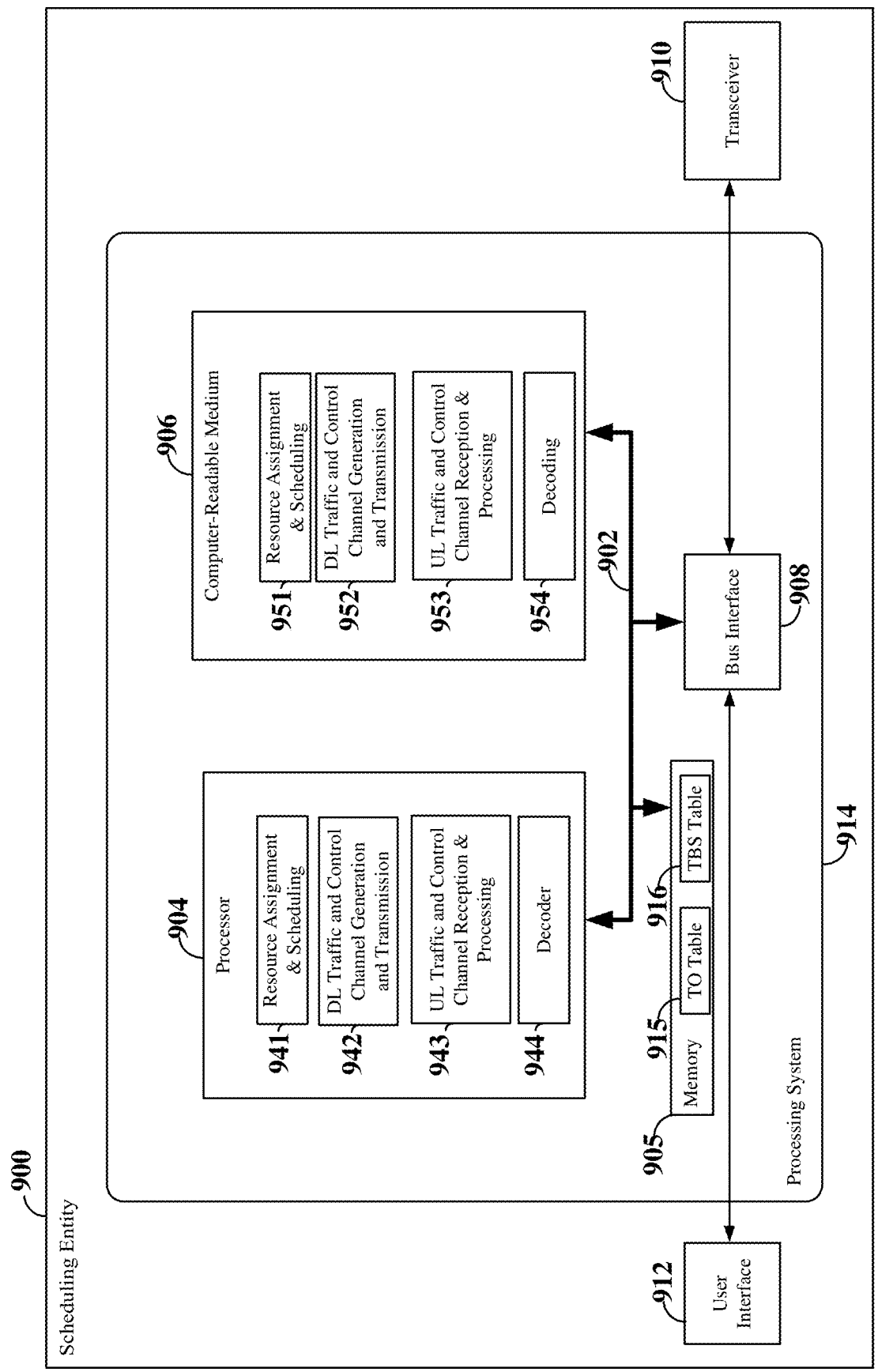
FIG. 9 is a block diagram illustrating an example of a hardware implementation for a scheduling entity apparatus employing a processing system in accordance with aspects of the present disclosure.

FIG. 9 is a block diagram illustrating an example of a hardware implementation for a scheduling entity 900 employing a processing system 914. For example, the scheduling entity 900 may be a base station as illustrated in any one or more of FIGS. 1 and/or 2. In another example, the scheduling entity 900 may be a user equipment (UE) as illustrated in any one or more of FIGS. 1 and 2.

The scheduling entity 900 may be implemented with a processing system 914 that includes one or more processors 904. Examples of processors 904 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In various examples, the scheduling entity 900 may be configured to perform any one or more of the functions described herein. That is, the processor 904, as utilized in a scheduling entity 900, may be used to implement any one or more of the processes and procedures described below. The processor 904 may in some instances be implemented via a baseband or modem chip and in other implementations, the processor 904 may itself comprise a number of devices distinct and different from a baseband or modem chip (e.g., in such scenarios is may work in concert to achieve embodiments discussed herein). And as mentioned above, various hardware arrangements and components outside of a baseband modem processor can be used in implementations, including RF-chains, power amplifiers, modulators, buffers, interleavers, adders/summers, etc.

In this example, the processing system 914 may be implemented with a bus architecture, represented generally by the bus 902. The bus 902 may include any number of interconnecting buses and bridges depending on the specific application of the processing system 914 and the overall design constraints. The bus 902 communicatively couples together various circuits including one or more processors (represented generally by the processor 904), a memory 905, and computer-readable media (represented generally by the computer-readable medium 906). The bus 902 may also link various other circuits such as timing sources, peripherals, voltage regulators, and power management circuits, which are well known in the art, and therefore, will not be described any further. A bus interface 908 provides an interface between the bus 902 and a transceiver 910. The transceiver 910 provides a communication interface or means for communicating with various other apparatus over a transmission medium. Depending upon the nature of the apparatus, a user interface 912 (e.g., keypad, display, speaker, microphone, joystick) may also be provided. Of course, such a user interface 912 is optional, and may be omitted in some examples, such as a base station.

The processor 904 is responsible for managing the bus 902 and general processing, including the execution of software stored on the computer-readable medium 906. The software, when executed by the processor 904, causes the processing system 914 to perform the various functions described below for any particular apparatus. The computer-readable medium 906 and the memory 905 may also be used for storing data that is manipulated by the processor 904 when executing software.

One or more processors 904 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 906.

The computer-readable medium 906 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium 906 may reside in the processing system 914, external to the processing system 914, or distributed across multiple entities including the processing system 914. The computer-readable medium 906 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

In some aspects of the disclosure, the processor 904 may include circuitry configured for various functions. For example, the processor 904 may include resource assignment and scheduling circuitry 941, configured to generate, schedule, and modify a resource assignment or grant of time-frequency resources (e.g., a set of one or more resource elements). For example, the resource assignment and scheduling circuitry 941 may schedule time-frequency resources within a plurality of time division duplex (TDD) and/or frequency division duplex (FDD) subframes to carry traffic and/or control information to and/or from multiple UEs (scheduled entities).

In accordance with various aspects of the present disclosure, the resource assignment and scheduling circuitry 941 may access a transmission option (TO) table 915 maintained, for example, in memory 905 to schedule uplink or downlink transmissions for a scheduled entity (UE). The transmission option table 915 may include a plurality of transmission options, each including a respective number of resource blocks and a respective modulation and coding scheme (MCS) index. In addition, each of the transmission options in the table 915 may be associated with one or more puncturing patterns, some of which may hinder decoding at the receiver. An example of a portion of a transmission option table 915 may include the table 800 shown in FIG. 8 for PUSCH.

The resource assignment and scheduling circuitry 941 may render a scheduling decision for at least two consecutive subframes, each having the same transmission direction, based on the table 915. In some examples, the scheduling decision includes at least a selected transmission option from the table 915 for communication of a codeword between the scheduling entity and a scheduled entity (UE) in a given subframe of the at least two consecutive subframes. In particular, the resource assignment and scheduling circuitry 941 may select at least one aspect of the scheduling decision for communication of the codeword in the given subframe to reduce decoding errors of the codeword at the receiver. For example, the at least one aspect may include one or more of a transmission option, a puncturing pattern, transport block size, or decoder/decoding algorithm for the codeword and/or scheduling of another codeword within the at least two consecutive subframes.

The below description is provided for an uplink subframe carrying a PUSCH. However, it should be understood that the description may be equally applied to a downlink subframe carrying a PDSCH or other symbols.

In some examples, when scheduling a given (current) uplink subframe for transmitting a PUSCH for a particular UE, the resource assignment and scheduling circuitry 941 may utilize the table 915 to avoid scheduling any of the transmission options and associated puncturing patterns that may hinder decoding at the receiver listed in the table 915. For example, the resource assignment and scheduling circuitry 941 may determine whether the UE will need to puncture the current uplink subframe to create a guard period between the current uplink subframe and an immediately preceding uplink subframe as a result of different narrowbands being assigned to the UE in the current uplink subframe and the immediately preceding uplink subframe. If a guard period is necessary, the resource assignment and scheduling circuitry 941 may avoid scheduling any of the combinations of MCS index, number of resource blocks, and problematic puncturing patterns listed in the table 915 for the PUSCH for the particular UE in the current subframe. In some examples, the resource assignment and scheduling circuitry 941 may simply avoid scheduling any transmission options that have problematic puncturing patterns listed in the table 915. The resource assignment and scheduling circuitry 941 may then either select a transmission option and associated puncturing pattern from the table 915 that enables decoding at the receiver or schedule the PUSCH for the UE within a later uplink subframe if there are no other transmission options and associated puncturing patterns that are not problematic available for the current subframe.

In other examples, the resource assignment and scheduling circuitry 941 may modify the selected problematic puncturing pattern to puncture different symbols in the current uplink subframe and the immediately preceding/subsequent subframe or to puncture fewer symbols in the current uplink subframe and the immediate preceding/subsequent subframe. The modified puncturing pattern may be included within the downlink control information (DCI) carrying the uplink grant for the codeword.

In still other examples, after scheduling a first uplink subframe for the UE to transmit a PUSCH, the resource assignment and scheduling circuitry 941 may modify at least one aspect of the scheduling decision related to a second consecutive uplink subframe for the UE based on the table 915. For example, the resource assignment and scheduling circuitry 941 may utilize the table 915 to determine whether the UE will need to puncture the first uplink subframe to create a guard period between the first uplink subframe and the second uplink subframe that will result in one of the problematic puncturing patterns for the transmission option selected for the first uplink subframe listed in the table 915. If the UE will need to puncture the first subframe utilizing one of the problematic puncturing patterns listed for the transmission option already selected by the resource assignment and scheduling circuitry 941 for the first uplink subframe, the resource assignment and scheduling circuitry 941 may modify the scheduling decision for the second uplink subframe to prevent the UE from puncturing the first uplink subframe to create the guard period.

In some examples, the resource assignment and scheduling circuitry 941 may modify the narrowband assigned to the second uplink subframe to match that of the first uplink subframe so that the UE does not need to create the guard period, thereby preventing the problematic puncturing pattern in the first uplink subframe. In other examples, the resource assignment and scheduling circuitry 941 may cancel scheduling of a planned uplink transmission in the second uplink subframe for the UE. For example, the resource assignment and scheduling circuitry 941 may re-schedule uplink transmission originally planned for the second uplink subframe to another subsequent subframe that is not contiguous with the first uplink subframe.

By canceling scheduling of the planned uplink transmission in the second uplink subframe for the UE, the UE may not need to create the guard period or may not need to utilize the particular problematic puncturing pattern, depending on any re-scheduling of the second uplink subframe. For example, if the resource assignment and scheduling circuitry 941 does not schedule any uplink transmissions within the second uplink subframe, the UE will not need to create the guard period between the first and second uplink subframes. As another example, if the resource assignment and scheduling circuitry 941 re-schedules the second uplink subframe to utilize the same narrowband as the first uplink subframe (e.g., as a result of scheduling different uplink information in the second uplink subframe), the UE will not need to create the guard period between the first and second uplink subframes. As yet another example, if the resource assignment and scheduling circuitry 941 re-schedules the second uplink subframe to include a different narrowband than the first uplink subframe, but different uplink information (e.g., a PUCCH instead of a PUSCH or a PUSCH instead of a PUCCH), the resulting puncturing pattern required for the first subframe may not be problematic. The resource assignment and scheduling circuitry 941 may further operate in coordination with resource assignment and scheduling software 951.

The processor 904 may further include downlink (DL) traffic and control channel generation and transmission circuitry 942, configured to generate and transmit downlink traffic and control signals/channels. For example, the DL traffic and control channel generation and transmission circuitry 942 may be configured to generate a physical downlink control channel (PDCCH) including downlink control information (DCI) and/or a physical downlink shared channel (PDSCH) including downlink traffic. In addition, the DL traffic and control channel generation and transmission circuitry 942 may operate in coordination with the resource assignment and scheduling circuitry 941 to schedule the DL traffic and/or control information and to place the DL traffic and/or control information onto a time division duplex (TDD) or frequency division duplex (FDD) carrier within one or more subframes or time slots in accordance with the resources assigned to the DL traffic and/or control information. The DL traffic and control channel generation and transmission circuitry 942 may further be configured to multiplex DL transmissions utilizing time division multiplexing (TDM), code division multiplexing (CDM), frequency division multiplexing (FDM), orthogonal frequency division multiplexing (OFDM), sparse code multiplexing (SCM), or other suitable multiplexing schemes.

In accordance with various aspects of the disclosure, the DL traffic and control channel generation and transmission circuitry 942 may be configured to access the TO table 915 to generate and transmit a downlink transmission, such as a PDSCH, to a UE. In some examples, when generating a PDSCH transmission for a given downlink subframe, the DL traffic and control channel generation and transmission circuitry 942 may operate in coordination with the resource assignment and scheduling circuitry 941 to modify a transport block size for the PDSCH transmission based on the table 915. For example, the DL traffic and control channel generation and transmission circuitry 942 may determine whether the PDSCH needs to be punctured at the UE for the given downlink subframe, and if so, whether, based on the assigned transmission option for the given downlink subframe (e.g., the MCS and number of resource blocks allocated for the PDSCH transmission in the given downlink subframe), the particular puncturing pattern may result in one of the problematic puncturing patterns for the assigned transmission option based on the table 915.

In some examples, to mitigate the decoding errors, the transport block (TB) size for a selected transmission option listed in the transmission option table 915 may be modified. The TB size is determined based on the selected MCS and number of resource blocks allocated to the scheduled entity, as obtained from a TB S table 916 maintained, for example, in memory 905. For example, upon determining the MCS index and number of resource blocks assigned to the PDSCH transmission, the DL traffic and control channel generation and transmission circuitry 942 and/or resource assignment and scheduling circuitry 941 may access the TBS table 916 to look-up the TB size corresponding to the MCS index and number of RBs. The TB size table 916 may be modified to include different TB sizes for the problematic transmission options as illustrated in FIG. 8 (e.g., the combinations of MCS index and number of resource blocks included within the transmission option table 915). In some examples, the transport block size may also be modified based on the associated puncturing patterns. For example, the TB size table 916 may include multiple entries for the problematic transmission options, with different TB sizes being utilized for different puncturing patterns.

In some examples, the DL traffic and control channel generation and transmission circuitry 942 may further generate and transmit one or more PDCCH, each containing DCI indicating the scheduling decision (e.g., a downlink assignment or uplink grant) for at least one of the two or more consecutive subframes. For example, the DCI may indicate the selected transmission option, selected puncturing pattern or modified puncturing pattern (if applicable), and selected transport block size (if applicable). The DL traffic and control channel generation and transmission circuitry 942 may further operate in coordination with DL data and control channel generation and transmission software 952.

The processor 904 may further include uplink (UL) traffic and control channel reception and processing circuitry 943, configured to receive and process uplink control channels and uplink traffic channels from one or more scheduled entities. For example, the UL traffic and control channel reception and processing circuitry 943 may be configured to receive uplink traffic (e.g., a PUSCH) from one or more scheduled entities. The UL traffic and control channel reception and processing circuitry 943 may further be configured to receive a Physical Uplink Control Channel (PUCCH). The UL traffic and control channel reception and processing circuitry 943 may further operate in coordination with UL traffic and control channel reception and processing software 953.

The processor 904 may further include a decoder 944, configured to receive and decode an uplink codeword produced from an uplink transmission including one or more punctured PUSCH symbols in an uplink subframe. In some examples, the decoder 944 may be a turbo decoder running a BCJR algorithm (MAP algorithm). In some examples, if the PUSCH symbols punctured from the uplink subframe result in systematic bits (information bits within the PUSCH symbols) for which the LLRs converge to zero, the turbo decoder 944 may run a Viterbi algorithm with the LLRs of the systematic and parity 1/parity 2 bits for one or both of the convolutional decoders of the turbo decoder 944. The tail bits in the trellis termination of the turbo code may then be utilized to obtain the message bits (information bits) that will result in the correct termination. In other examples, the turbo decoder 944 may try different combinations of the punctured bits that result in a cyclic redundancy code (CRC) pass to attempt to decode the codeword containing the punctured subframe(s). The decoder 944 may further operate in coordination with decoding software 954.

Figure 10:
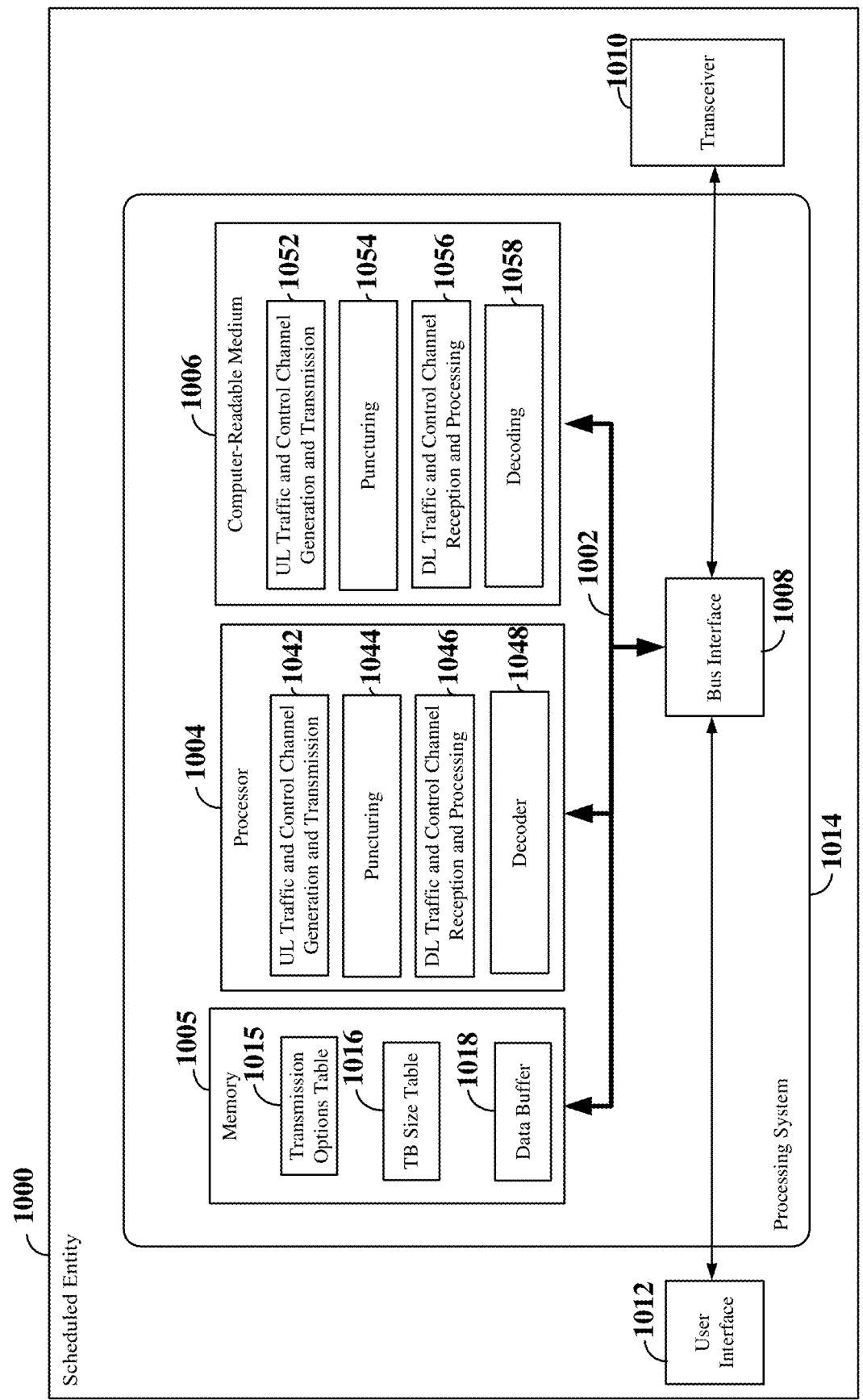
FIG. 10 is a block diagram illustrating an example of a hardware implementation for a scheduled entity apparatus employing a processing system in accordance with aspects of the present disclosure.

FIG. 10 is a conceptual diagram illustrating an example of a hardware implementation for an exemplary scheduled entity 1000 employing a processing system 1014. In accordance with various aspects of the disclosure, an element, or any portion of an element, or any combination of elements may be implemented with a processing system 1014 that includes one or more processors 1004. For example, the scheduled entity 1000 may be a user equipment (UE) as illustrated in any one or more of FIGS. 1 and/or 2. In various aspects of the present disclosure, the scheduled entity may be a BL/CE UE implementing eMTC, as described in Release 13 and/or Release 14 of LTE.

The processing system 1014 may be substantially the same as the processing system 914 illustrated in FIG. 9, including a bus interface 1008, a bus 1002, memory 1005, a processor 1004, and a computer-readable medium 1006. Furthermore, the scheduled entity 1000 may include a user interface 1012 and a transceiver 1010 substantially similar to those described above in FIG. 9. That is, the processor 1004, as utilized in a scheduled entity 1000, may be used to implement any one or more of the processes described below.

In some aspects of the disclosure, the processor 1004 may include uplink (UL) traffic and control channel generation and transmission circuitry 1042, configured to generate and transmit uplink control/feedback/acknowledgement information on an UL control channel. For example, the UL traffic and control channel generation and transmission circuitry 1042 may be configured to generate and transmit an uplink control channel (e.g., a Physical Uplink Control Channel (PUCCH)) containing uplink control information (UCI). In addition, the UL traffic and control channel generation and transmission circuitry 1042 may be configured to generate and transmit uplink traffic on an UL traffic channel (e.g., a PUSCH) in accordance with an uplink grant.

In accordance with various aspects of the disclosure, the UL traffic and control channel generation and transmission circuitry 1042 may be configured to access a transmission option table 1015 maintained, for example, in memory 1005 to generate and transmit an uplink transmission to the base station. The transmission option table 1015 may include a plurality of transmission options, each including a respective number of resource blocks and a respective modulation and coding scheme (MCS) index. In addition, each of the transmission options in the table 1015 may be associated with one or more puncturing patterns, some of which may hinder decoding at the base station. An example of a portion of a transmission option table 1015 may include the table 800 shown in FIG. 8. In addition, the transmission option table 1015 may correspond to the transmission option table 915 shown in FIG. 9.

In some examples, when generating a PUSCH transmission for a given (current) uplink subframe, the UL traffic and control channel generation and transmission circuitry 1042 may utilize the table 1015 to modify at least one aspect (e.g., the puncturing pattern or a transport block size) of a scheduling decision for the PUSCH transmission based on the table 1015. For example, the UL traffic and control channel generation and transmission circuitry 1042 may determine whether the PUSCH needs to be punctured for the current uplink subframe to create a guard period between the current uplink subframe and an immediately preceding uplink subframe and/or an immediately subsequent subframe as a result of different narrowbands being assigned to the scheduled entity 1000 in the current uplink subframe and the immediately preceding/subsequent uplink subframe. If a guard period is necessary, the UL traffic and control channel generation and transmission circuitry 1042 may determine whether, based on the assigned transmission option for the current uplink subframe (e.g., the MCS and number of resource blocks allocated to the UE for the current uplink subframe), the particular puncturing pattern typically utilized to create the guard period between the current uplink subframe and the immediately preceding/subsequent subframe may result in one of the problematic puncturing patterns for the assigned transmission option based on the table 1015.

For example, if the immediately preceding subframe includes a PUCCH transmitted within a first narrowband and the current uplink subframe includes a PUSCH transmitted within a second, different narrowband, the puncturing pattern for the current uplink subframe includes the first two PUSCH symbols, assuming a regular PUCCH format was utilized. Looking at the table in FIG. 8, if the assigned transmission option for the current uplink subframe includes the combination of an MCS index of ten and five resource blocks, the puncturing pattern for the current uplink subframe may result in decoding errors at the base station.

In some examples, to mitigate the decoding errors, the UL traffic and control channel generation and transmission circuitry 1042 may modify the puncturing pattern and operate in coordination with puncturing circuitry 1044 to puncture different symbols in the current uplink subframe and the immediately preceding/subsequent subframe or to puncture fewer symbols in the current uplink subframe and the immediate preceding/subsequent subframe. Using the above example from FIG. 8, the UL traffic and control channel generation and transmission circuitry 1042 may modify the puncturing pattern to cause the puncturing circuitry 1044 to puncture the last symbol of the immediately preceding subframe containing the PUCCH and only the first symbol of the current uplink subframe containing the PUSCH. As another example, if there is a continuous PUSCH transmission over three or more consecutive uplink subframes with narrowband hopping between each of the uplink subframes, the normal (conventional) puncturing pattern requires puncturing the first and last PUSCH symbols in each subframe. If puncturing the first two symbols or the last two symbols of the current uplink subframe results in reduced decoding errors (e.g., fewer numbers of bits converging to zero) at the base station, the UL traffic and control channel generation and transmission circuitry 1042 may cause the puncturing circuitry 1044 to puncture the first two or the last two PUSCH symbols in the current uplink subframe instead of the first and last PUSCH symbol.

As yet another example, if the scheduled entity 1000 is able to retune from one narrowband to another narrowband faster (e.g., within the duration of one symbol instead of two symbols), the UL traffic and control channel generation and transmission circuitry 1042 may modify the puncturing pattern to cause the puncturing circuitry 1044 to puncture fewer PUSCH symbols between the two consecutive uplink subframes to avoid the problematic puncturing patterns for each of the consecutive uplink subframes. In this example, the base station may detect the signal from the scheduled entity (UE) on the symbols that are not punctured and attempt decoding based on the detected signal.

In other examples, to mitigate the decoding errors, the transport block (TB) size for the transmission options listed in the transmission option table 1015 may be modified. The TB size is determined based on the selected MCS and number of resource blocks allocated to the scheduled entity, as obtained from a TB size table 1016 maintained, for example, in memory 1005. For example, upon determining the MCS index and number of resource blocks assigned to the scheduled entity for a particular uplink transmission, the UL traffic and control channel generation and transmission circuitry 1042 may access the TB size table 1016 to look-up the TB size corresponding to the MCS index and number of RBs. The TB size table 1016 may be modified to include different TB sizes for the problematic transmission options as illustrated in FIG. 8 (e.g., the combinations of MCS index and number of resource blocks included within the transmission option table 1015).

In some examples, the transport block size may also be modified based on the associated puncturing patterns. For example, the TB size table 1016 may include multiple entries for the problematic transmission options, with different TB sizes being utilized for different puncturing patterns. For example, for the problematic case of MCS index equal to fourteen with three RBs assigned to a UE, the modified TB size may be utilized for only the six problematic puncturing patterns shown in FIG. 8. The UL traffic and control channel generation and transmission circuitry 1042 may operate in coordination with UL traffic and control channel generation and transmission software 1052. In addition, the puncturing circuitry 1044 may operate in coordination with puncturing software 1054.

The processor 1004 may further include downlink (DL) traffic and control channel reception and processing circuitry 1046, configured for receiving and processing downlink traffic on a traffic channel (e.g., PDSCH), and to receive and process control information (e.g., a downlink assignment or uplink grant) on one or more downlink control channels. In some examples, received downlink traffic and/or control information may be temporarily stored in a data buffer 1018 within memory 1005.

In various aspects of the disclosure, the DL traffic and control channel reception and processing circuitry 1046 may further be configured to puncture a received PDSCH in a given (current) downlink subframe to enable the scheduled entity 1000 to retune from one narrowband (e.g., the narrowband utilized for the given downlink subframe or a previous downlink subframe) to another narrowband (e.g., the narrowband utilized for the given downlink subframe or a subsequent downlink subframe). To mitigate the decoding errors, the DL traffic and control channel reception and processing circuitry 1046 may modify the puncturing pattern, based on the TO table 1015, to puncture different symbols in the current downlink subframe or to puncture fewer symbols in the current downlink subframe. The DL traffic and control channel reception and processing circuitry 1046 may operate in coordination with DL traffic and control channel reception and processing software 1056.

The processor 1004 may further include a decoder 1048, configured to receive and decode a downlink codeword produced from a downlink transmission including one or more punctured PDSCH symbols (punctured at the scheduled entity 1000) in a downlink subframe. In some examples, the decoder 1048 may be a turbo decoder running a BCJR algorithm (MAP algorithm). In some examples, if the PDSCH symbols punctured from the downlink subframe result in systematic bits (information bits within the PDSCH symbols) for which the LLRs converge to zero, the turbo decoder 1048 may run a Viterbi algorithm with the LLRs of the systematic and parity 1/parity 2 bits for one or both of the convolutional decoders of the turbo decoder 1048. The tail bits in the trellis termination of the turbo code may then be utilized to obtain the message bits (information bits) that will result in the correct termination. In other examples, the turbo decoder 1048 may try different combinations of the punctured bits that result in a cyclic redundancy code (CRC) pass to attempt to decode the codeword containing the punctured subframe(s). The decoder 1048 may further operate in coordination with decoding software 1058.

Figure 11:
FIG. 11 is a table illustrating examples of combinations of MCS index and number of RBs for which a modified transport block size reduces the decoding errors at the receiver, in accordance with aspects of the present disclosure.

FIG. 11 is a table illustrating examples of combinations of MCS index and number of RBs for which a modified transport block size for PUSCH reduces the decoding errors at the receiver, in accordance with aspects of the present disclosure. FIG. 11 includes the same combinations of MCS index and number of RBs (transmission options) as in FIG. 8 for which a particular puncturing pattern hinders decoding at the receiver. FIG. 11 further includes a modified transport block size for which the decoding errors at the receiver are not observed. For example, for each transmission option utilizing an MCS index of fourteen and three RBs, if the transport block size is increased from 744 bits to 760 bits, the decoding errors at the receiver are mitigated. Similarly, for each transmission option utilizing an MCS index of ten with five RBs, if the transport block size is decreased from 872 bits to 856 bits, the decoding errors at the receiver are mitigated.

FIG. 11 further illustrates the modified effective code rate for each transmission option and puncturing pattern when the TB size is modified as shown in FIG. 11. As can be seen in FIG. 11, the modified code rate for the modified TB size for each of the transmission options is slightly shifted with respect to the original effective code rate for the original TB size.

Figure 12:
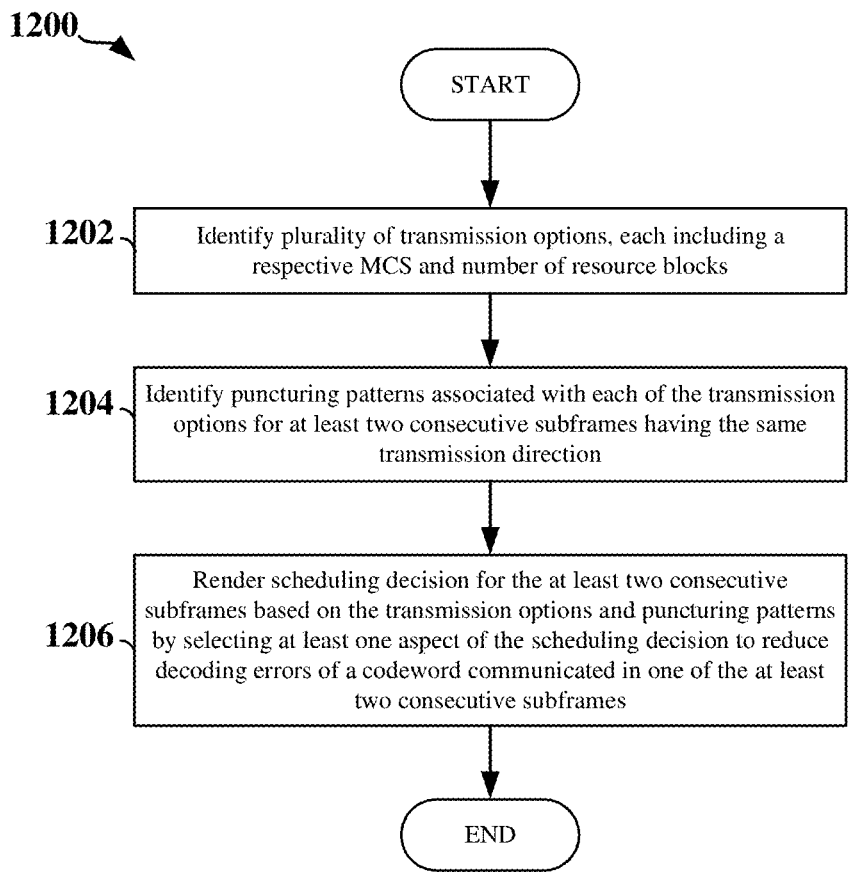
FIG. 12 is a flow chart illustrating an exemplary process for a scheduling entity to mitigate decoding errors due to puncturing, in accordance with aspects of the disclosure.

FIG. 12 is a flow chart illustrating an exemplary process 1200 for a scheduling entity to mitigate decoding errors due to puncturing, in accordance with aspects of the present disclosure. As described below, some or all illustrated features may be omitted in a particular implementation within the scope of the present disclosure, and some illustrated features may not be required for implementation of all embodiments. In some examples, the process 1200 may be carried out by the scheduling entity 900 illustrated in FIG. 9. In some examples, the process 1200 may be carried out by any suitable apparatus or means for carrying out the functions or algorithm described below.

At block 1202, the scheduling entity may identify a plurality of transmission options, each including a respective number of resource blocks and a respective modulation and coding scheme (MCS). At block 1204, the scheduling entity may identify respective puncturing patterns for each of the transmission options for at least two consecutive subframes, each having a same transmission direction. In some examples, the puncturing patterns enable retuning of a user equipment (UE) from a first narrowband utilized by the UE in a first subframe to a second narrowband utilized by the UE in a second subframe. In some examples, one or more of the puncturing patterns associated with one or more of the transmission options may hinder decoding of a codeword communicated between the scheduling entity and the UE within a given subframe of the at least two consecutive subframes. For example, the resource assignment and scheduling circuitry 941 shown and described above in reference to FIG. 9 may access a transmission option table 915 to identify the plurality of transmission options and associated puncturing patterns.

At block 1206, the scheduling entity may render a scheduling decision for the at least two consecutive subframes based on the transmission options and associated puncturing patterns. In some examples, the scheduling entity may render the scheduling decision by selecting at least one aspect of the scheduling decision to reduce decoding errors of the codeword communicated in the given subframe. In some examples, the at least two consecutive subframes may include uplink subframes and the codeword may be communicated over physical uplink shared channel (PUSCH) SC-FDMA symbols. In other examples, the at least two consecutive subframes may include downlink subframes and the codeword may be communicated over physical downlink shared channel (PDSCH) SC-FDMA symbols.

In some examples, the scheduling entity may render the scheduling decision by avoiding scheduling any of the transmission options that have problematic puncturing patterns or avoiding scheduling the problematic puncturing patterns for any of the transmission options for the at least two consecutive subframes for a UE. In other examples, the scheduling entity may render the scheduling decision by modifying a narrowband scheduled for a second one of the at least two consecutive subframes to match a first one of the at least two consecutive subframes. In still other examples, the scheduling entity may cancel scheduling of a second codeword for communication between the scheduling entity and the UE in the second subframe to avoid puncturing the codeword communicated in the first subframe. Other aspects of the scheduling decision may further be selected to reduce decoding errors of the codeword at the receiver. For example, the resource assignment and scheduling circuitry 941 shown and described above in reference to FIG. 9 may render the scheduling decision for the at least two consecutive subframes.

Figure 13:
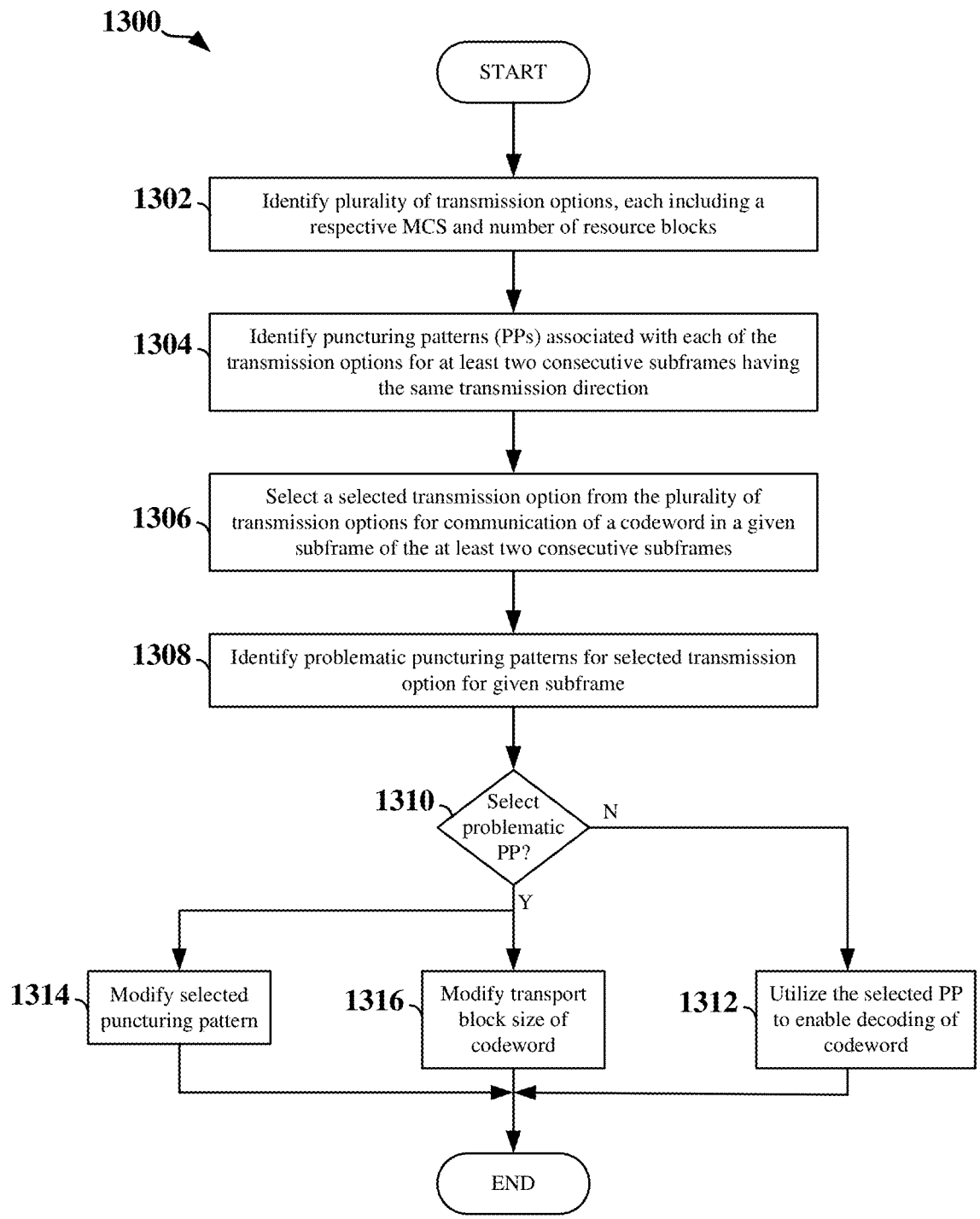
FIG. 13 is a flow chart illustrating another exemplary process for a scheduling entity to mitigate decoding errors due to puncturing, in accordance with aspects of the disclosure.

FIG. 13 is a flow chart illustrating an exemplary process 1300 for a scheduling entity to mitigate decoding errors due to puncturing, in accordance with aspects of the present disclosure. As described below, some or all illustrated features may be omitted in a particular implementation within the scope of the present disclosure, and some illustrated features may not be required for implementation of all embodiments. In some examples, the process 1300 may be carried out by the scheduling entity 900 illustrated in FIG. 9. In some examples, the process 1300 may be carried out by any suitable apparatus or means for carrying out the functions or algorithm described below.

At block 1302, the scheduling entity may identify a plurality of transmission options, each including a respective number of resource blocks and a respective modulation and coding scheme (MCS). At block 1304, the scheduling entity may identify respective puncturing patterns for each of the transmission options for at least two consecutive subframes, each having a same transmission direction. In some examples, the puncturing patterns enable retuning of a user equipment (UE) from a first narrowband utilized by the UE in a first subframe to a second narrowband utilized by the UE in a second subframe. In some examples, one or more of the puncturing patterns associated with one or more of the transmission options may hinder decoding of a codeword communicated between the scheduling entity and the UE within a given subframe of the at least two consecutive subframes. For example, the resource assignment and scheduling circuitry 941 shown and described above in reference to FIG. 9 may access a transmission option table 915 to identify the plurality of transmission options and associated puncturing patterns.

At block 1306, the scheduling entity may select a selected transmission option from the plurality of transmission options for communication of a codeword between the scheduling entity and the UE in a given subframe of the at least two consecutive subframes. In some examples, the at least two consecutive subframes may include uplink subframes and the codeword may be communicated over physical uplink shared channel (PUSCH) SC-FDMA symbols. In other examples, the at least two consecutive subframes may include downlink subframes and the codeword may be communicated over physical downlink shared channel (PDSCH) SC-FDMA symbols. For example, the resource assignment and scheduling circuitry 941 shown and described above in reference to FIG. 9 may select the selected transmission option.

At block 1308, the scheduling entity may identify problematic puncturing patterns for the selected transmission option for the given subframe that may hinder decoding of the codeword at the receiver. For example, the resource assignment and scheduling circuitry 941 shown and described above in reference to FIG. 9 may identify the problematic puncturing pattern(s) associated with the selected transmission option At block 1310, the scheduling entity may determine whether a selected puncturing pattern (PP) for the transmission option is problematic. If the selected puncturing pattern is not problematic (N branch of block 1310), at block 1312, the scheduling entity may utilize the selected puncturing pattern for communication of the codeword to enable decoding of the codeword at the receiver and allow the UE to retune narrowbands between the given subframe and an immediately consecutive (prior or subsequent) subframe. For example, the resource assignment and scheduling circuitry 941 shown and described above in reference to FIG. 9 may utilize the selected puncturing pattern for scheduling communication of the codeword in the given subframe.

If the selected puncturing pattern is problematic (Y branch of block 1310), the process proceeds to either block 1314 or block 1316. At block 1314, the scheduling entity may modify the selected puncturing pattern to puncture different symbols in the given subframe and the immediately preceding/subsequent subframe or to puncture fewer symbols in the given subframe and the immediate preceding/subsequent subframe. The modified puncturing pattern may be included within the downlink control information (DCI) carrying the downlink assignment or uplink grant for the codeword. For example, the resource assignment and scheduling circuitry 941 shown and described above in reference to FIG. 9 may modify the puncturing pattern.

At block 1316, the scheduling entity may modify a transport block size of the codeword. For example, upon determining the transport block size corresponding to the selected transmission option, the scheduling entity may access a table to identify a modified transport block size that may be utilized for the selected transmission option. In some examples, the transport block size may also be modified based on the associated puncturing patterns. For example, the DL traffic and control channel generation and transmission circuitry 942 and the resource assignment and scheduling circuitry 941 shown and described above in reference to FIG. 9 may modify the transport block size of the codeword.

Figure 14:
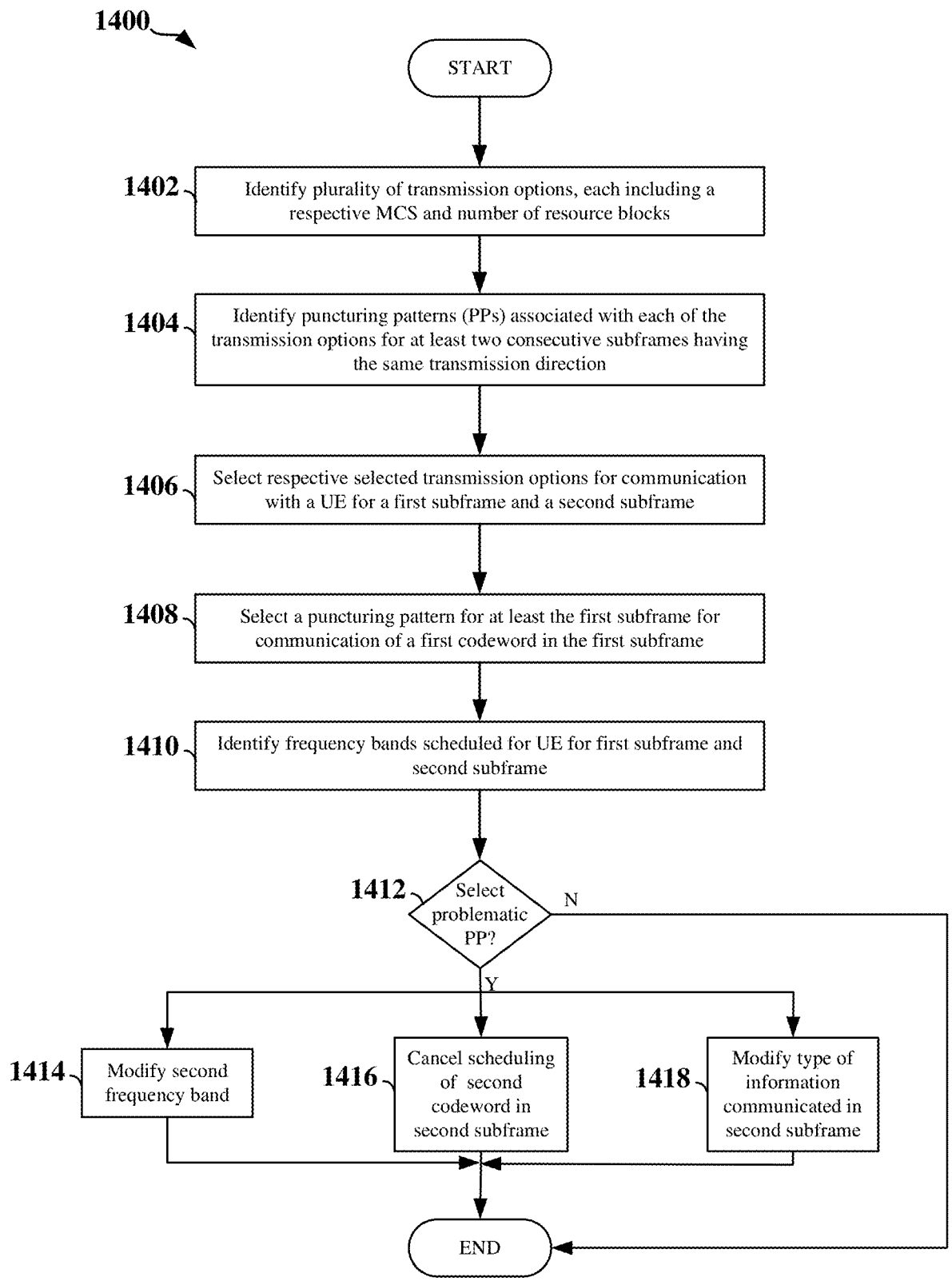
FIG. 14 is a flow chart illustrating another exemplary process for a scheduling entity to mitigate decoding errors due to puncturing, in accordance with aspects of the disclosure.

FIG. 14 is a flow chart illustrating an exemplary process 1400 for a scheduling entity to mitigate decoding errors due to puncturing, in accordance with aspects of the present disclosure. As described below, some or all illustrated features may be omitted in a particular implementation within the scope of the present disclosure, and some illustrated features may not be required for implementation of all embodiments. In some examples, the process 1400 may be carried out by the scheduling entity 900 illustrated in FIG. 9. In some examples, the process 1400 may be carried out by any suitable apparatus or means for carrying out the functions or algorithm described below.

At block 1402, the scheduling entity may identify a plurality of transmission options, each including a respective number of resource blocks and a respective modulation and coding scheme (MCS). At block 1404, the scheduling entity may identify respective puncturing patterns for each of the transmission options for at least two consecutive subframes, each having a same transmission direction. In some examples, the puncturing patterns enable retuning of a user equipment (UE) from a first narrowband utilized by the UE in a first subframe to a second narrowband utilized by the UE in a second subframe. In some examples, one or more of the puncturing patterns associated with one or more of the transmission options may hinder decoding of a codeword communicated between the scheduling entity and the UE within a given subframe of the at least two consecutive subframes. For example, the resource assignment and scheduling circuitry 941 shown and described above in reference to FIG. 9 may access a transmission option table 915 to identify the plurality of transmission options and associated puncturing patterns.

At block 1406, the scheduling entity may select respective selected transmission options from the plurality of transmission options for communication between the scheduling entity and the UE for a first subframe and a second subframe of the at least two consecutive subframes, where the first and second subframes are consecutive. In some examples, the first and second subframes may include uplink subframes and the codeword may be communicated over physical uplink shared channel (PUSCH) SC-FDMA symbols. In other examples, the first and second subframes may include downlink subframes and the codeword may be communicated over physical downlink shared channel (PDSCH) SC-FDMA symbols. For example, the resource assignment and scheduling circuitry 941 shown and described above in reference to FIG. 9 may select the selected transmission option.

At block 1408, the scheduling entity may determine that a guard period may need to be created by the UE between the first and second subframes, and may therefore, select a puncturing pattern associated with the selected transmission option for at least the first subframe for communication of a first codeword between the scheduling entity and the UE in the first subframe. For example, the resource assignment and scheduling circuitry 941 shown and described above in reference to FIG. 9 may select a puncturing pattern associated with the selected transmission option.

At block 1410, the scheduling entity may identify the narrowbands scheduled for the UE for the first subframe and the second subframe. For example, the resource assignment and scheduling circuitry 941 shown and described above in reference to FIG. 9 may identify the narrowbands from the selected transmission options.

At block 1412, the scheduling entity may determine whether the selected puncturing pattern (PP) for the selected transmission option for the first subframe is problematic. If the selected puncturing pattern is problematic (Y branch of block 1412), the process proceeds to either block 1414, block 1416, or block 1418. At block 1414, the scheduling entity may modify the second narrowband in the second subframe to match the first narrowband in the first subframe to avoid puncturing of the first codeword. For example, the resource assignment and scheduling circuitry 941 shown and described above in reference to FIG. 9 may modify the narrowband.

At block 1416, the scheduling entity may cancel scheduling of a second codeword in the second subframe to avoid puncturing of the first codeword in the first subframe. For example, the resource assignment and scheduling circuitry 941 shown and described above in reference to FIG. 9 may cancel scheduling of the second codeword.

At block 1418, the scheduling entity may modify a type of information (e.g., PUCCH or PUSCH) communicated in the second subframe to modify the puncturing pattern utilized in the first subframe. For example, the resource assignment and scheduling circuitry 941 may modify the type of information communicated in the second subframe.

Figure 15:
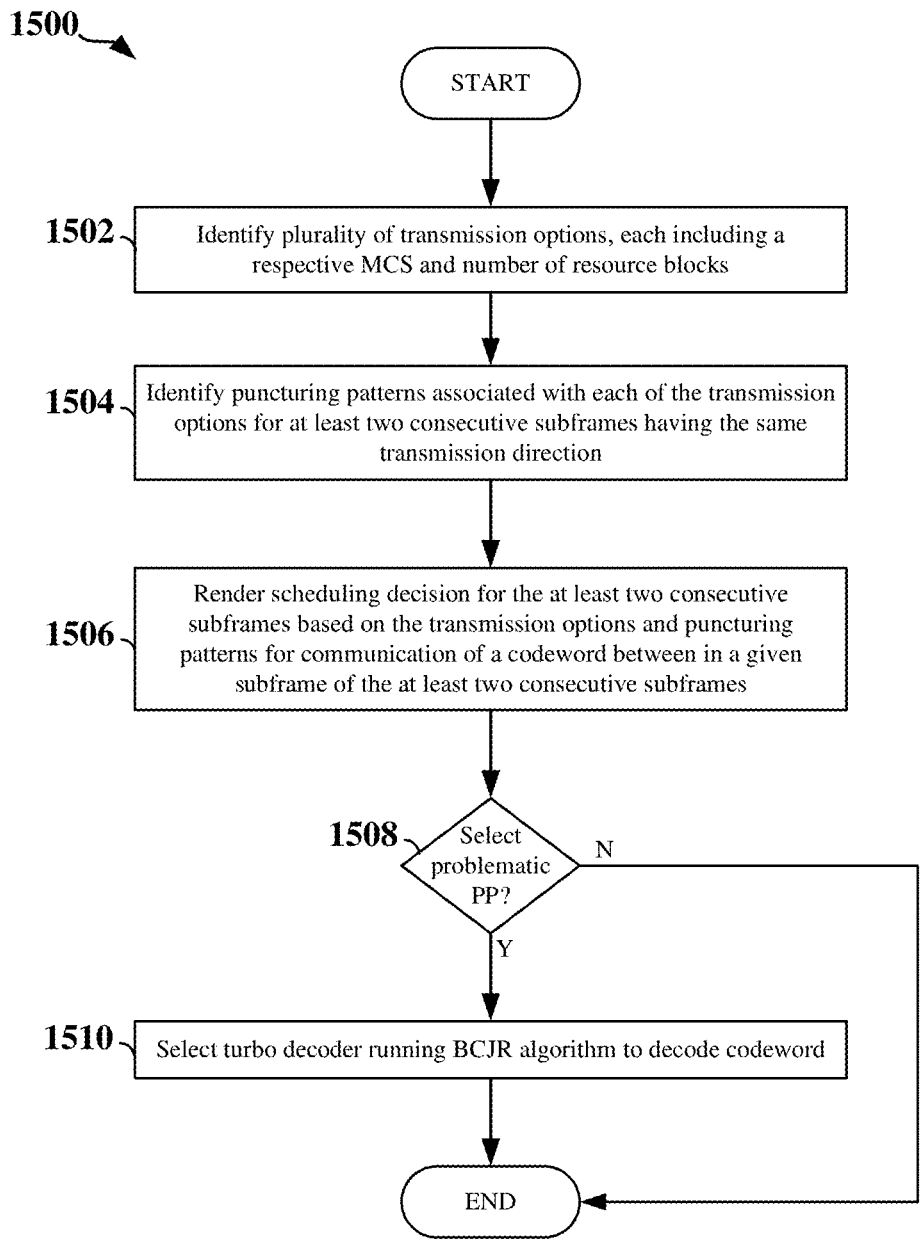
FIG. 15 is a flow chart illustrating another exemplary process for a scheduling entity to mitigate decoding errors due to puncturing, in accordance with aspects of the disclosure.

FIG. 15 is a flow chart illustrating an exemplary process 1500 for a scheduling entity to mitigate decoding errors due to puncturing, in accordance with aspects of the present disclosure. As described below, some or all illustrated features may be omitted in a particular implementation within the scope of the present disclosure, and some illustrated features may not be required for implementation of all embodiments. In some examples, the process 1500 may be carried out by the scheduling entity 900 illustrated in FIG. 9. In some examples, the process 1500 may be carried out by any suitable apparatus or means for carrying out the functions or algorithm described below.

At block 1502, the scheduling entity may identify a plurality of transmission options, each including a respective number of resource blocks and a respective modulation and coding scheme (MCS). At block 1504, the scheduling entity may identify respective puncturing patterns for each of the transmission options for at least two consecutive uplink subframes. In some examples, the puncturing patterns enable retuning of a user equipment (UE) from a first narrowband utilized by the UE in a first subframe to a second narrowband utilized by the UE in a second subframe. In some examples, one or more of the puncturing patterns associated with one or more of the transmission options may hinder decoding of a codeword communicated within a given subframe of the at least two consecutive uplink subframes at the scheduling entity. For example, the resource assignment and scheduling circuitry 941 shown and described above in reference to FIG. 9 may access a transmission option table 915 to identify the plurality of transmission options and associated puncturing patterns.

At block 1506, the scheduling entity may render a scheduling decision for the at least two consecutive uplink subframes based on the transmission options and associated puncturing patterns for communication of the codeword in the given subframe. For example, the resource assignment and scheduling circuitry 941 shown and described above in reference to FIG. 9 may render the scheduling decision for the at least two consecutive subframes.

At block 1508, the scheduling entity may determine whether the scheduling decision resulted in the selection of a problematic puncturing pattern that may hinder decoding of the codeword at the scheduling entity. If the selected puncturing pattern is problematic (Y branch of block 1508), at block 1510, the scheduling entity may select a turbo decoder running a BCJR algorithm (MAP algorithm) to decode the codeword received in the given uplink subframe. For example, the UL traffic and control channel reception and processing circuitry 943 and decoder 944 may select the turbo decoder running the BCJR algorithm to decode the received codeword.

Figure 16:
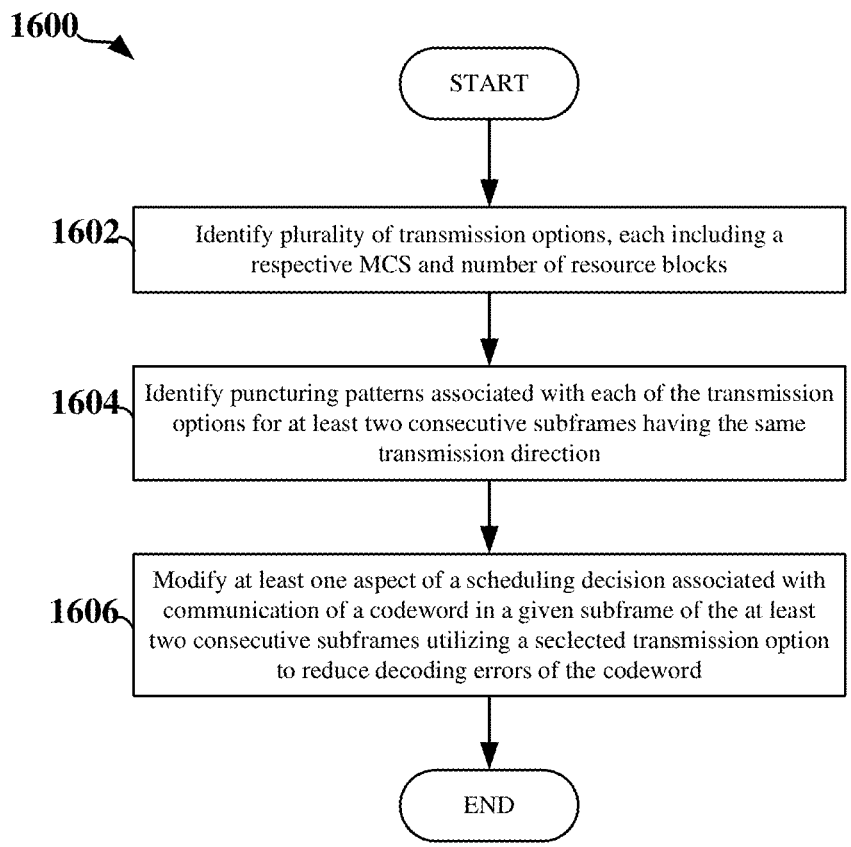
FIG. 16 is a flow chart illustrating an exemplary process for a scheduled entity to mitigate decoding errors due to puncturing, in accordance with aspects of the disclosure.

FIG. 16 is a flow chart illustrating an exemplary process 1600 for a scheduled entity (e.g., UE) to mitigate decoding errors due to puncturing, in accordance with aspects of the present disclosure. As described below, some or all illustrated features may be omitted in a particular implementation within the scope of the present disclosure, and some illustrated features may not be required for implementation of all embodiments. In some examples, the process 1600 may be carried out by the scheduled entity 1000 illustrated in FIG. 10. In some examples, the process 1600 may be carried out by any suitable apparatus or means for carrying out the functions or algorithm described below.

At block 1602, the scheduled entity may identify a plurality of transmission options, each including a respective number of resource blocks and a respective modulation and coding scheme (MCS). At block 1604, the scheduled entity may identify respective puncturing patterns for each of the transmission options for at least two consecutive subframes, each having a same transmission direction. In some examples, the puncturing patterns enable retuning of the scheduled entity from a first narrowband utilized by the scheduled entity in a first subframe to a second narrowband utilized by the scheduled entity in a second subframe. In some examples, one or more of the puncturing patterns associated with one or more of the transmission options may hinder decoding of a codeword communicated between the scheduled entity and a scheduling entity within a given subframe of the at least two consecutive subframes. For example, the UL traffic and control channel generation and transmission circuitry 1042 or the DL traffic and control channel reception and processing circuitry 1046, together with the puncturing circuitry 1044, shown and described above in reference to FIG. 10 may access a transmission option table 1015 to identify the plurality of transmission options and associated puncturing patterns.

At block 1606, the scheduled entity may modify at least one aspect of a scheduling decision associated with communication of the codeword in the given subframe, where the scheduling decision utilizes at least a selected transmission option, to reduce decoding errors of the codeword. In some examples, the scheduled entity may modify a puncturing pattern or a transport block size of the codeword. For example, the DL traffic and control channel reception and processing circuitry 1046 shown and described above in reference to FIG. 10 may receive a PDCCH including DCI carrying a downlink assignment or uplink grant indicating the scheduling decision and the UL traffic and control channel generation and transmission circuitry 1042 or the DL traffic and control channel reception and processing circuitry 1046, possibly together with the puncturing circuitry 1044, shown and described above in reference to FIG. 10, may modify the scheduling decision.

Figure 17:
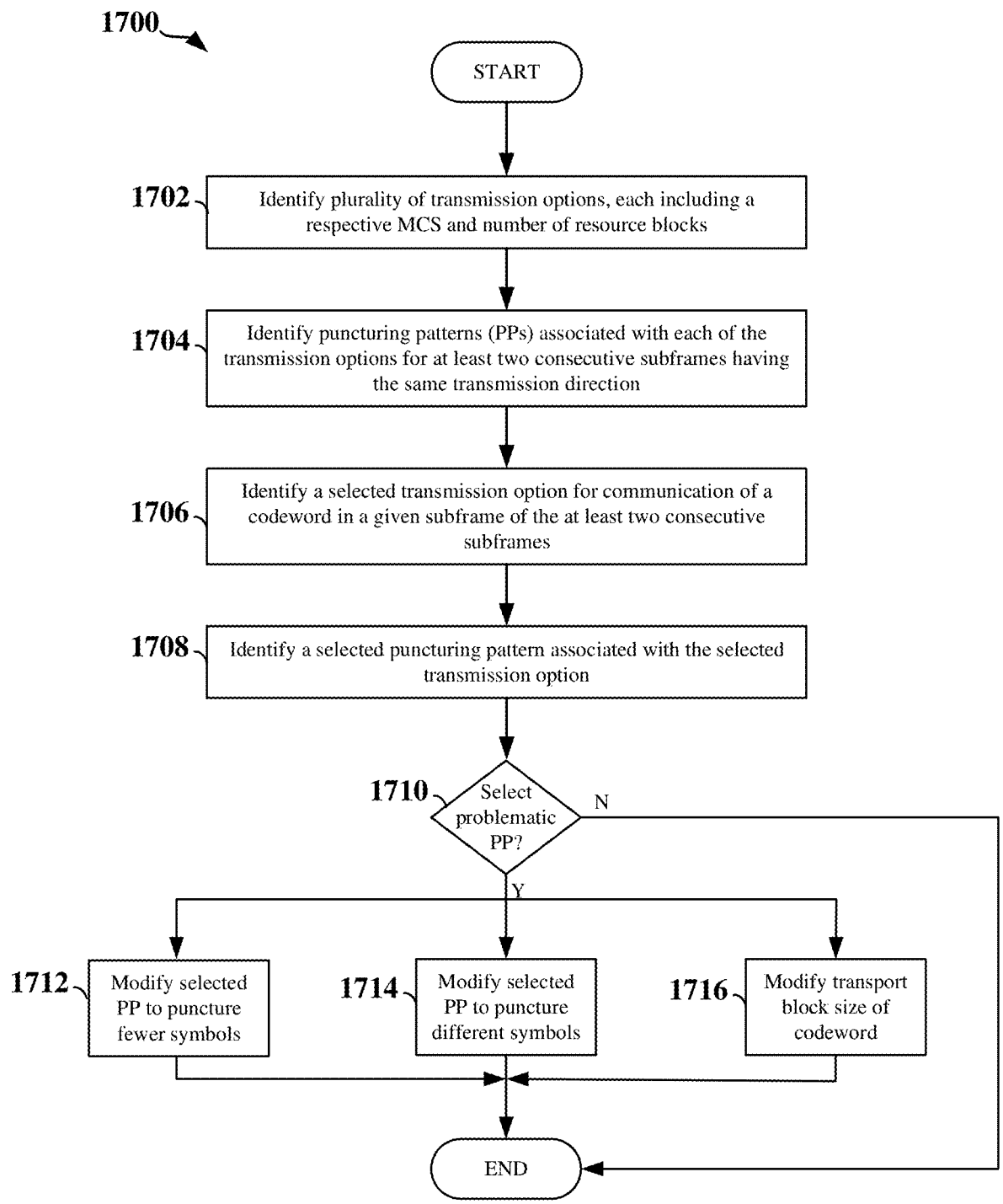
FIG. 17 is a flow chart illustrating another exemplary process for a scheduled entity to mitigate decoding errors due to puncturing, in accordance with aspects of the disclosure.

FIG. 17 is a flow chart illustrating an exemplary process 1700 for a scheduled entity (e.g., UE) to mitigate decoding errors due to puncturing, in accordance with aspects of the present disclosure. As described below, some or all illustrated features may be omitted in a particular implementation within the scope of the present disclosure, and some illustrated features may not be required for implementation of all embodiments. In some examples, the process 1700 may be carried out by the scheduled entity 1000 illustrated in FIG. 10. In some examples, the process 1700 may be carried out by any suitable apparatus or means for carrying out the functions or algorithm described below.

At block 1702, the scheduled entity may identify a plurality of transmission options, each including a respective number of resource blocks and a respective modulation and coding scheme (MCS). At block 1704, the scheduled entity may identify respective puncturing patterns for each of the transmission options for at least two consecutive subframes, each having a same transmission direction. In some examples, the puncturing patterns enable retuning of the scheduled entity from a first narrowband utilized by the scheduled entity in a first subframe to a second narrowband utilized by the scheduled entity in a second subframe. In some examples, one or more of the puncturing patterns associated with one or more of the transmission options may hinder decoding of a codeword communicated between the scheduled entity and a scheduling entity within a given subframe of the at least two consecutive subframes. For example, the UL traffic and control channel generation and transmission circuitry 1042 or the DL traffic and control channel reception and processing circuitry 1046, together with the puncturing circuitry 1044, shown and described above in reference to FIG. 10 may access a transmission option table 1015 to identify the plurality of transmission options and associated puncturing patterns.

At block 1706, the scheduled entity may identify a selected transmission option for communication of the codeword in the given subframe. At block 1708, the scheduled entity may further identify a selected puncturing pattern associated with the selected transmission option for puncturing the codeword. For example, the DL traffic and control channel reception and processing circuitry 1046 shown and described above in reference to FIG. 10 may receive a PDCCH including DCI carrying a downlink assignment or uplink grant indicating the selected transmission option and the puncturing circuitry 1044 shown and described above in reference to FIG. 10 may identify a puncturing pattern to utilize for the selected transmission option from the transmission options table 1015.

At block 1710, the scheduled entity may determine whether the selected puncturing pattern is problematic (e.g., may hinder decoding of the codeword). If the selected puncturing pattern is problematic (Y branch of block 1710), the process may proceed to either block 1712, block 1714, or block 1716. At block 1712, the scheduled entity may modify the selected puncturing pattern to puncture fewer symbols associated with the codeword. At block 1714, the scheduled entity may modify the selected puncturing pattern to puncture different symbols associated with the codeword. For example, the puncturing circuitry 1044 shown and described above in reference to FIG. 10 may modify the puncturing pattern.

At block 1716, for uplink transmissions, the scheduled entity may modify the transport block size of the codeword. For example, the UL traffic and control channel generation and transmission circuitry 1042 shown and described above in reference to FIG. 10 may utilize the transport block size table 1016 to modify the transport block size of the codeword for the selected transmission option.

Several aspects of a wireless communication network have been presented with reference to an exemplary implementation. As those skilled in the art will readily appreciate, various aspects described throughout this disclosure may be extended to other telecommunication systems, network architectures and communication standards.

By way of example, various aspects may be implemented within other systems defined by 3GPP, such as Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-17 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-3, 9 and/or 10 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method of wireless communication at a scheduling entity in a wireless communication network, the method comprising:
    identifying a plurality of transmission options, each comprising a respective number of resource blocks and a respective modulation and coding scheme (MCS);
    identifying respective puncturing patterns associated with each of the plurality of transmission options for at least two consecutive subframes, each comprising a same transmission direction;
    scheduling different narrowbands for communication between the scheduling entity and a user equipment (UE) in the at least two consecutive subframes;
    selecting a selected transmission option of the plurality of transmission options for communication of a first codeword between the scheduling entity and the UE in a given subframe of the at least two consecutive subframes; and
    selecting a selected puncturing pattern of the respective puncturing patterns associated with the selected transmission option to be applied in the given subframe based on the different narrowbands scheduled in the at least two consecutive subframes that enables decoding of the first codeword.

2. The method of claim 1, wherein the respective puncturing patterns associated with each of the plurality of transmission options enable retuning of the UE from a first narrowband utilized in a first subframe of the at least two consecutive subframes to a second narrowband utilized in a second subframe of the at least two consecutive subframes.

3. The method of claim 1, wherein selecting the selected puncturing pattern further comprises:
    selecting an initial puncturing pattern of the respective puncturing patterns associated with the selected transmission option; and
    modifying the initial puncturing pattern to produce the selected puncturing pattern associated with the selected transmission option for communication of the first codeword in the given subframe.

4. The method of claim 1, further comprising:
    identifying a first narrowband scheduled for the UE within a first subframe of the at least two consecutive subframes based on the selected transmission option; and
    identifying a second narrowband scheduled for the UE within a second subframe of the at least two consecutive subframes based on the selected transmission option, wherein the second subframe is immediately subsequent to the first subframe.

5. The method of claim 4, wherein the first subframe comprises the given subframe and further comprising:
    modifying the second narrowband scheduled for the second subframe to match the first narrowband scheduled for the first subframe for communication of the first codeword within the first subframe utilizing the selected puncturing pattern that avoids puncturing of the first codeword.

6. The method of claim 4, wherein the first subframe comprises the given subframe and further comprising:
    canceling scheduling of a second codeword for communication between the scheduling entity and the UE in the second subframe to utilize the selected puncturing pattern that avoids puncturing of the first codeword in the first subframe; and
    rescheduling the second codeword in a subsequent subframe subsequent to the second subframe.

7. The method of claim 4, wherein the first subframe comprises the given subframe and wherein selecting the selected puncturing pattern further comprises:
    selecting an initial puncturing pattern of the respective puncturing patterns associated with the selected transmission option; and
    modifying a type of information scheduled for communication between the scheduling entity and the UE in the second subframe to modify the initial puncturing pattern to produce the selected puncturing pattern that enables decoding of the first codeword.

8. The method of claim 1, wherein selecting the selected transmission option further comprises:
    modifying a transport block size associated with the selected transmission option for communication of the first codeword within the given subframe to enable decoding of the first codeword.

9. The method of claim 1, further comprising:
    selecting a turbo decoder running a Bahl-Cocke-Jelinek-Raviv (BCJR) algorithm for decoding of the first codeword communicated in the given subframe.

10. The method of claim 1, wherein each of the at least two consecutive subframes comprise single-carrier frequency division multiple access (SC-FDMA) symbols.

11. The method of claim 10, wherein each of the at least two consecutive subframes comprises physical uplink shared channel (PUSCH) SC-FDMA symbols or physical downlink shared channel (PDSCH) SC-FDMA symbols.

12. A scheduling entity within a wireless communication network, comprising:
    a processor;
    a memory communicatively coupled to the processor; and
    a transceiver communicatively coupled to the processor, wherein the processor is configured to:
        identify a plurality of transmission options, each comprising a respective number of resource blocks and a respective modulation and coding scheme (MCS);
        identify respective puncturing patterns associated with each of the plurality of transmission options for at least two consecutive subframes, each comprising a same transmission direction;
        schedule different narrowbands for communication between the scheduling entity and a user equipment (UE) in the at least two consecutive subframes;

select a selected transmission option of the plurality of transmission options for communication of a first codeword between the scheduling entity and the UE in a given subframe of the at least two consecutive subframes; and select a selected puncturing pattern of the respective puncturing patterns associated with the selected transmission option to be applied in the given subframe based on the different narrowbands scheduled in the at least two consecutive subframes that enables decoding of the first codeword.

13. The scheduling entity of claim 12, wherein the processor is further configured to:

select an initial puncturing pattern of the respective puncturing patterns associated with the selected transmission option; and modify the initial puncturing pattern to produce the selected puncturing pattern associated with the selected transmission option for communication of the first codeword in the given subframe.

14. The scheduling entity of claim 12, wherein the processor is further configured to:

identify a first narrowband scheduled for the UE within a first subframe of the at least two consecutive subframes based on the selected transmission option; and identify a second narrowband scheduled for the UE within a second subframe of the at least two consecutive subframes based on the selected transmission option, wherein the second subframe is immediately subsequent to the first subframe.

15. The scheduling entity of claim 14, wherein the first subframe comprises the given subframe and wherein the processor is further configured to:

modify the second narrowband scheduled for the second subframe to match the first narrowband scheduled for the first subframe for communication of the first codeword within the first subframe utilizing the selected puncturing pattern that avoids puncturing of the first codeword.

16. The scheduling entity of claim 14, wherein the first subframe comprises the given subframe and wherein the processor is further configured to:

cancel scheduling of a second codeword for communication between the scheduling entity and the UE in the second subframe to utilize the selected puncturing pattern that avoids puncturing of the first codeword in the first subframe; and reschedule the second codeword in a subsequent subframe subsequent to the second subframe.

17. The scheduling entity of claim 14, wherein the first subframe comprises the given subframe and wherein the processor is further configured to:

select an initial puncturing pattern of the respective puncturing patterns associated with the selected transmission option; and modify a type of information scheduled for communication between the scheduling entity and the UE in the second subframe to modify the initial puncturing pattern to produce the selected puncturing pattern that enables decoding of the first codeword.

18. The scheduling entity of claim 12, wherein the processor is further configured to:

modify a transport block size associated with the selected transmission option for communication of the first codeword within the given subframe to enable decoding of the first codeword.

19. The scheduling entity of claim 12, wherein the processor is further configured to:

select a turbo decoder running a Bahl-Cocke-Jelinek-Raviv (BCJR) algorithm for decoding of the codeword communicated in the given subframe.

20. A method of wireless communication at a scheduled entity in wireless communication with a scheduling entity in a wireless communication network, the method comprising:

identifying a plurality of transmission options, each comprising a respective number of resource blocks and a respective modulation and coding scheme (MCS);

identifying respective puncturing patterns associated with each of the plurality of transmission options for at least two consecutive subframes, each comprising a same transmission direction; and modifying at least one aspect of a scheduling decision made by the scheduling entity and associated with communication of a codeword between the scheduling entity and the scheduled entity in a given subframe of the at least two consecutive subframes to reduce decoding errors of the codeword;

wherein the scheduling decision comprises a selected transmission option of the plurality of transmission options and a selected puncturing pattern of the respective puncturing patterns associated with the selected transmission option, the selected puncturing pattern being selected based on different narrowbands being scheduled in the at least two consecutive subframes; and wherein the at least one aspect comprises at least one of the selected puncturing pattern or a transport block size associated with the codeword.

21. The method of claim 20, wherein the respective puncturing patterns associated with each of the plurality of transmission options enable retuning of the scheduled entity from a first narrowband utilized in a first subframe of the at least two consecutive subframes to a second narrowband utilized in a second subframe of the at least two consecutive subframes.

22. The method of claim 20, wherein modifying the at least one aspect of the scheduling decision further comprises:

identifying the selected puncturing pattern of the respective puncturing patterns associated with the selected transmission option; and modifying the selected puncturing pattern to puncture fewer symbols in the codeword communicated in the given subframe.

23. The method of claim 20, wherein modifying at least one aspect of the scheduling decision further comprises:

identifying the selected puncturing pattern of the respective puncturing patterns associated with the selected transmission option; and modifying the selected puncturing pattern to puncture different symbols in the codeword communicated in the given subframe.

24. The method of claim 20, wherein modifying the at least one aspect of the scheduling decision further comprises:

identifying the selected puncturing pattern of the respective puncturing patterns associated with the selected transmission option; and modifying the transport block size associated with the selected transmission option for communication of the first codeword within the given subframe to enable decoding of the first codeword, wherein the at least two consecutive subframes comprise uplink subframes.

25. A user equipment in wireless communication with a scheduling entity within a wireless communication network, comprising:
- a processor;
- a memory communicatively coupled to the processor; and
- a transceiver communicatively coupled to the processor, wherein the processor is configured to:
  - identify a plurality of transmission options, each comprising a respective number of resource blocks and a respective modulation and coding scheme (MCS);
  - identify respective puncturing patterns associated with each of the plurality of transmission options for at least two consecutive subframes, each comprising a same transmission direction; and
  - modify at least one aspect of a scheduling decision made by the scheduling entity and associated with communication of a codeword between the scheduling entity and the scheduled entity in a given subframe of the at least two consecutive subframes to reduce decoding errors of the codeword;
- wherein the scheduling decision comprises a selected transmission option of the plurality of transmission options and a selected puncturing pattern of the respective puncturing patterns associated with the selected transmission option, the selected puncturing pattern being selected based on different narrowbands being scheduled in the at least two consecutive subframes; and
- wherein the at least one aspect comprises at least one of the selected puncturing pattern or a transport block size associated with the codeword.

26. The user equipment of claim 25, wherein the processor is further configured to:
- identify the selected puncturing pattern of the respective puncturing patterns associated with the selected transmission option; and
- modify the selected puncturing pattern to puncture fewer symbols in the codeword communicated in the given subframe.

27. The user equipment of claim 25, wherein the processor is further configured to:
- identify the selected puncturing pattern of the respective puncturing patterns associated with the selected transmission option; and
- modify the selected puncturing pattern to puncture different symbols in the codeword communicated in the given subframe.

28. The user equipment of claim 25, wherein the processor is further configured to:
- identify the selected puncturing pattern of the respective puncturing patterns associated with the selected transmission option; and
- modify the transport block size associated with the selected transmission option for communication of the first codeword within the given subframe to enable decoding of the codeword, wherein the at least two consecutive subframes comprise uplink subframes.

* * * * *